United States Patent
Hill

(10) Patent No.: US 7,289,226 B2
(45) Date of Patent: *Oct. 30, 2007

(54) CHARACTERIZATION AND COMPENSATION OF ERRORS IN MULTI-AXIS INTERFEROMETRY SYSTEMS

(75) Inventor: Henry A. Hill, Tucson, AZ (US)

(73) Assignee: Zygo Corporation, Middlefield, CT (US)

( * ) Notice: Subject to any disclaimer, the term of this patent is extended or adjusted under 35 U.S.C. 154(b) by 425 days.

This patent is subject to a terminal disclaimer.

(21) Appl. No.: 10/981,316

(22) Filed: Nov. 4, 2004

(65) Prior Publication Data

US 2005/0134862 A1    Jun. 23, 2005

Related U.S. Application Data

(60) Provisional application No. 60/517,431, filed on Nov. 4, 2003.

(51) Int. Cl.
 *G01B 11/02* (2006.01)
(52) U.S. Cl. .................. 356/500; 356/508
(58) Field of Classification Search ........ 356/399–401, 356/486, 493, 498, 500, 508–510
See application file for complete search history.

(56) References Cited

U.S. PATENT DOCUMENTS

| | | | |
|---|---|---|---|
| 4,711,573 A | 12/1987 | Wijntjes | |
| 4,714,339 A | 12/1987 | Lau | |
| 4,790,651 A | 12/1988 | Brown | |
| 4,802,765 A | 2/1989 | Young | |
| 4,958,082 A | 9/1990 | Makinouchi et al. | |
| 5,064,289 A | 11/1991 | Bockman | |
| 5,114,234 A | 5/1992 | Otsuka | |
| 5,151,749 A | 9/1992 | Saburo et al. | |
| 5,187,543 A | 2/1993 | Ebert | |
| 5,331,400 A | 7/1994 | Hou | |
| 5,363,196 A | 11/1994 | Cameron | |
| 5,408,318 A | 4/1995 | Slater | |
| 5,663,793 A | 9/1997 | Groot | |
| 5,663,893 A | 9/1997 | Wampler | |

(Continued)

FOREIGN PATENT DOCUMENTS

EP    0 848-299    6/1998

(Continued)

OTHER PUBLICATIONS

Badami, V.G. et al. "Investigation of nonlinearity in high accuracy heterodyne laser interferometry." 1997 American Society for Precision Engineering Proceedings, 16, pp. 153-156.

(Continued)

*Primary Examiner*—Patrick Connolly
(74) *Attorney, Agent, or Firm*—Fish & Richardson P.C.

(57) ABSTRACT

In general, in one aspect, the invention features a method that includes monitoring a position of a stage along a first measurement axis and a second measurement axis of a multi-axis interferometry system and determining a position of the stage with respect to another degree of freedom based on the monitored positions along the first and second axes and predetermined information about how the measurement axes deviate from being parallel to one another.

42 Claims, 9 Drawing Sheets

U.S. PATENT DOCUMENTS

| | | | |
|---|---|---|---|
| 5,724,136 A | 3/1998 | Zanoni | |
| 5,757,160 A | 5/1998 | Kreuzer | |
| 5,764,361 A | 6/1998 | Kato | |
| 5,781,277 A | 7/1998 | Iwamoto | |
| 5,790,253 A | 8/1998 | Kamiya | |
| 5,801,832 A | 9/1998 | Van Den Brink | |
| 6,008,902 A | 12/1999 | Rinn | |
| 6,020,964 A | 2/2000 | Loopstra | |
| 6,040,096 A | 3/2000 | Kakizaki | |
| 6,046,792 A | 4/2000 | Van Der Werf | |
| 6,134,007 A | 10/2000 | Naraki | |
| 6,137,574 A | 10/2000 | Hill | |
| 6,159,644 A | 12/2000 | Satoh | |
| 6,160,619 A | 12/2000 | Magome | |
| 6,181,420 B1 | 1/2001 | Badami et al. | |
| 6,246,481 B1 | 6/2001 | Hill | |
| 6,252,668 B1 | 6/2001 | Hill | |
| 6,271,922 B1 | 8/2001 | Bulow | |
| 6,271,923 B1 | 8/2001 | Hill | |
| 6,304,318 B1 | 10/2001 | Matsumoto | |
| 6,313,918 B1 | 11/2001 | Hill | |
| 6,330,105 B1 | 12/2001 | Rozelle | |
| 6,384,899 B1 | 5/2002 | den Boef | |
| 6,541,759 B1 | 4/2003 | Hill | |
| 6,778,280 B2 | 8/2004 | De Groot et al. | |
| 6,806,961 B2 | 10/2004 | Hill | |
| 6,839,641 B1 | 1/2005 | Kirwan | |
| 6,842,256 B2 | 1/2005 | Hill | |
| 7,019,843 B2 | 3/2006 | Hill | |
| 2001/0035959 A1 | 11/2001 | Hill | |
| 2002/0048026 A1 | 4/2002 | Isshiki | |
| 2002/0089671 A1 | 7/2002 | Hill | |
| 2002/0171844 A1 | 11/2002 | Hill | |
| 2003/0090675 A1 | 5/2003 | Fujiwara | |
| 2003/0094584 A1 | 5/2003 | Yui et al. | |
| 2003/0164948 A1 | 9/2003 | Hill | |
| 2003/0174341 A1 | 9/2003 | Hill | |
| 2003/0223077 A1* | 12/2003 | Hill | 356/498 |
| 2004/061869 A1* | 4/2004 | Hill | 356/508 |
| 2004/0085545 A1 | 5/2004 | Hill | |
| 2004/0085546 A1* | 5/2004 | Hill | 356/500 |
| 2005/0002040 A1* | 1/2005 | Adriaens et al. | 356/500 |
| 2005/0018206 A1 | 1/2005 | Hill | |
| 2005/0134862 A1* | 6/2005 | Hill | 356/500 |
| 2005/0157309 A1* | 7/2005 | Hill | 356/508 |
| 2006/0072119 A1* | 4/2006 | Hill et al. | 356/500 |

FOREIGN PATENT DOCUMENTS

| | | |
|---|---|---|
| EP | 0 848 299 | 6/1998 |
| JP | 8-117083 | 10/1997 |
| JP | 7-351078 | 11/1997 |
| JP | 10-260009 | 9/1998 |

OTHER PUBLICATIONS

Bennett, S.J. "A double-passed michelson interferometer." Optics Communications, 4:6, pp. 428.430, 1972.

Bobroff, N. "Recent advances in displacement measureing interferometry." Meas. Sci. Technol, 4, pp. 907-926, 1993.

Hines et al. "Sub-nonmeter laser metrology—some techniques and models." ESO Conference on High-Resolution Imaging by interferometry II, pp. 1195-1204, 1991.

Oka, K. et al. "Polarization heterodyne interferometry using another local oscillator beam." Optics Communication, 92, pp. 1-5, 1992.

Wu, C.M. et al. "Analytical modeling of the periodic nonlinearity in heterodyne interferometry." Applied Optics, 37:28, pp. 6696-6700, 1998.

C. Zanoni, *VDI Berichte Nr.* 749, 93-106 (1989).

* cited by examiner

CHARACTERIZATION AND COMPENSATION OF ERRORS IN MULTI-AXIS INTERFEROMETRY SYSTEMS

CROSS-REFERENCE TO RELATED APPLICATIONS

This application claims priority under 35 U.S.C. §119(e)(1) to Provisional Patent Application No. 60/517,431, entitled "CHARACTERIZATION AND COMPENSATION OF NON-CYCLIC ERRORS IN METROLOGY SYSTEMS," filed on Nov. 4, 2003, the entire contents of which is hereby incorporated by reference.

BACKGROUND

This invention relates to interferometers, e.g., linear and angular displacement measuring and dispersion interferometers, that measure linear and angular displacements of a measurement object such as a mask stage or a wafer stage in a lithography scanner or stepper system, and also interferometers that monitor wavelength and determine intrinsic properties of gases.

Displacement measuring interferometers monitor changes in the position of a measurement object relative to a reference object based on an optical interference signal. The interferometer generates the optical interference signal by overlapping and interfering a measurement beam reflected from the measurement object with a reference beam reflected from a reference object.

In many applications, the measurement and reference beams have orthogonal polarizations and different frequencies. The different frequencies can be produced, for example, by laser Zeeman splitting, by acousto-optical modulation, or internal to the laser using birefringent elements or the like. The orthogonal polarizations allow a polarizing beam-splitter to direct the measurement and reference beams to the measurement and reference objects, respectively, and combine the reflected measurement and reference beams to form overlapping exit measurement and reference beams. The overlapping exit beams form an output beam that subsequently passes through a polarizer. The polarizer mixes polarizations of the exit measurement and reference beams to form a mixed beam. Components of the exit measurement and reference beams in the mixed beam interfere with one another so that the intensity of the mixed beam varies with the relative phase of the exit measurement and reference beams.

A detector measures the time-dependent intensity of the mixed beam and generates an electrical interference signal proportional to that intensity. Because the measurement and reference beams have different frequencies, the electrical interference signal includes a "heterodyne" signal having a beat frequency equal to the difference between the frequencies of the exit measurement and reference beams. If the lengths of the measurement and reference paths are changing relative to one another, e.g., by translating a stage that includes the measurement object, the measured beat frequency includes a Doppler shift equal to $2 v n p/\lambda$, where $v$ is the relative speed of the measurement and reference objects, $\lambda$ is the wavelength of the measurement and reference beams, n is the refractive index of the medium through which the light beams travel, e.g., air or vacuum, and p is the number of passes to the reference and measurement objects. Changes in the phase of the measured interference signal correspond to changes in the relative position of the measurement object, e.g., a change in phase of $2\pi$ corresponds substantially to a distance change L of $\lambda/(2 np)$. Distance 2L is a round-trip distance change or the change in distance to and from a stage that includes the measurement object. In other words, the phase $\Phi$, ideally, is directly proportional to L, and can be expressed as $$\Phi = 2 pkL \cos^2 \theta \quad (1)$$

for a plane mirror interferometer, e.g., a high stability plane mirror interferometer, where $$k = \frac{2\pi n}{\lambda}$$

and $\theta$ is the orientation of the measurement object with respect to a nominal axis of the interferometer. This axis can be determined from the orientation of the measurement object where $\Phi$ is maximized. Where $\theta$ is small, Equation (1) can be approximated by $$\Phi = 2 pkL(1-\theta^2) \quad (2)$$

Unfortunately, the observable interference phase, $\tilde{\Phi}$, is not always identically equal to phase $\Phi$. Many interferometers include, for example, non-linearities such as those known as "cyclic errors." The cyclic errors can be expressed as contributions to the observable phase and/or the intensity of the measured interference signal and have a sinusoidal dependence on the change in for example optical path length 2 pnL. A first order cyclic error in phase has, for example, a sinusoidal dependence on $(4\pi pnL)/\lambda$ and a second order cyclic error in phase has, for example, a sinusoidal dependence on $2(4\pi pnL)/\lambda$. Higher order cyclic errors can also be present as well as sub-harmonic cyclic errors and cyclic errors that have a sinusoidal dependence of other phase parameters of an interferometer system comprising detectors and signal processing electronics.

There are in addition to the cyclic errors, non-cyclic non-linearities or non-cyclic errors. An example of a source of a non-cyclic error is the diffraction of optical beams in the measurement paths of an interferometer. Non-cyclic error due to diffraction has been determined for example by analysis of the behavior of a system such as found in the work of J.-P. Monchalin, M. J. Kelly, J. E. Thomas, N. A. Kurnit, A. Szöke, F. Zernike, P. H. Lee, and A. Javan, "Accurate Laser Wavelength Measurement With A Precision Two-Beam Scanning Michelson Interferometer," *Applied Optics*, 20(5), 736-757, 1981. A second source of non-cyclic errors is the effect of "beam shearing" of optical beams across interferometer elements and the lateral shearing of reference and measurement beams one with respect to the other. Beam shearing can be caused, for example, by a change in direction of propagation of the input beam to an interferometer or a change in orientation of the object mirror in a double pass plane mirror interferometer such as a differential plane mirror interferometer (DPMI) or a high stability plane mirror interferometer (HSPMI).

Accordingly, due to errors such as the aforementioned cyclic and non-cyclic errors, the observable interference phase typically includes contributions in addition to $\Phi$. Thus, the observable phase is more accurately expressed as $$\tilde{\Phi} = \Phi + \psi + \zeta \quad (3)$$

where $\psi$ and $\zeta$ are the contributions due to the cyclic and non-cyclic errors, respectively.

The effect of contributions to the observable phase due to cyclic and non-cyclic errors can be reduced by quantifying these errors in each interferometer and correcting subsequent measurements with this data. Different techniques for quantifying cyclic errors are described in commonly owned U.S. Pat. No. 6,252,668, U.S. Pat. No. 6,246,481, U.S. Pat. No. 6,137,574, and U.S. patent application Ser. No. 10/287,898 entitled "INTERFEROMETRIC CYCLIC ERROR COMPENSATION" filed Nov. 5, 2002 by Henry A. Hill, the entire contents each of which are incorporated herein by reference. In order to compensate for these contributions, cyclic error compensating systems and methods can be used to determine a cyclic error function characterizing the cyclic error contribution to the observed phase. Examples of apparatus and details of methods that can be used to characterize non-cyclic errors in interferometers and interferometer components are described in U.S. patent application Ser. No. 10/366,587 entitled "CHARACTERIZATION AND COMPENSATION OF NON-CYCLIC ERRORS IN INTERFEROMETRY SYSTEMS," to Henry A. Hill, filed on Feb. 12, 2003, the entire contents of which are incorporated herein by reference.

Assuming any contributions due to cyclic and/or non-cyclic errors are small or otherwise compensated, according to Equation (2) the observable phase measured by a displacement measuring interferometer should be equal to 2 pkL $(1-\theta^2)$. This relationship assumes that the optical path difference between the measurement and reference beam is equal to 2 pkL $(1-\theta^2)$ and allows one to readily determine L, a displacement of the measurement object from the interferometer, from the measured phase, provided the orientation of the measurement object is known.

In the case of an interferometric metrology system including two or more linear displacement plane mirror interferometers used, in part, to measure a change in angular orientation of a measurement object, the observable phases measured by the two or more interferometers should each be of the form 2 pkL $(1-\theta^2)$. The resulting differences of phases obtained either optically or electronically can be used to compute a change in angular orientation of a measurement object common to the two or more plane mirror interferometers, provided that the measurement axes of the two or more interferometers are parallel.

The interferometers described above are often crucial components of scanner systems and stepper systems used in lithography to produce integrated circuits on semiconductor wafers. Such lithography systems typically include a translatable stage to support and fix the wafer, focusing optics used to direct a radiation beam onto the wafer, a scanner or stepper system for translating the stage relative to the exposure beam, and one or more interferometers. Each interferometer directs a measurement beam to, and receives a reflected measurement beam from, a plane mirror attached to the stage. Each interferometer interferes its reflected measurement beams with a corresponding reference beam, and collectively the interferometers accurately measure changes in the position of the stage relative to the radiation beam. The interferometers enable the lithography system to precisely control which regions of the wafer are exposed to the radiation beam.

In practice, the interferometry systems are used to measure the position of the wafer stage along multiple measurement axes. For example, defining a Cartesian coordinate system in which the wafer stage lies in the x-y plane, measurements are typically made of the x and y positions of the stage as well as the angular orientation of the stage with respect to the z axis, as the wafer stage is translated along the x-y plane. Furthermore, it may be desirable to also monitor tilts of the wafer stage out of the x-y plane. For example, accurate characterization of such tilts may be necessary to calculate Abbe offset errors in the x and y positions. Thus, depending on the desired application, there may be up to five degrees of freedom to be measured. Moreover, in some applications, it is desirable to also monitor the position of the stage with respect to the z-axis, resulting in a sixth degree of freedom.

To measure each degree of freedom, an interferometer is used to monitor distance changes along a corresponding metrology axis. For example, in systems that measure the x and y positions of the stage as well as the angular orientation of the stage with respect to the x, y, and z axes, at least three spatially separated measurement beams reflect from one side of the wafer stage and at least two spatially separated measurement beams reflect from another side of the wafer stage. See, e.g., U.S. Pat. No. 5,801,832 entitled "METHOD OF AND DEVICE FOR REPETITIVELY IMAGING A MASK PATTERN ON A SUBSTRATE USING FIVE MEASURING AXES," the contents of which are incorporated herein by reference. Each measurement beam is recombined with a reference beam to monitor optical path length changes along the corresponding metrology axes. Because the different measurement beams contact the wafer stage at different locations, the angular orientation of the wafer stage can then be derived from appropriate combinations of the optical path length measurements. Accordingly, for each degree of freedom to be monitored, the system includes at least one measurement beam that contacts the wafer stage. Furthermore, as described above, each measurement beam may double-pass the wafer stage to prevent changes in the angular orientation of the wafer stage from corrupting the interferometric signal. The measurement beams may be generated from physically separate interferometers or from multi-axes interferometers that generate multiple measurement beams.

SUMMARY

Multi-axis interferometry systems can be used to monitor the position of a stage along two or more parallel measurement axes. These monitored positions can be used to determine other degrees of freedom of the stage. For example, an orientation angle of the stage can be determined from the difference in the position of the stage along the two parallel axes. As another example, the orientation angle can be used to determine the Abbé offset error when using a multi-axis interferometry system to determine the location of an artifact (e.g., an alignment mark) on the stage along an axis parallel to, but offset from, the measurement axes.

Typically, when such degrees of freedom are calculated from the monitored positions, a system assumes that the measurement axes of the interferometry system are perfectly parallel. However, in reality, the axes can deviate from being parallel to one another. In the event of such axis misalignment, the distance between the measurement axes vary depending on the location of the stage along the measurement axes. Thus, the accuracy of measurements calculated assuming a constant distance between the measurement axes can be compromised.

Reducing sources of a deviation of nominally parallel measurement axes from being parallel can mitigate measurement errors associated with the deviation. Examples of sources include misalignment between interferometers forming the interferometry system, as well as defects in one or more of the interferometer components. Such defects can include, for example, bulk defects and/or surface defects, as well as misalignment between different components of an interferometer.

Alternatively, or additionally, to reducing sources of axis misalignment, in some embodiments, the accuracy an interferometry system can be improved by accounting for any misalignment of nominally parallel measurement axes. This accounting can be achieved by measuring deviations of the measurement axes from being parallel to one another prior to using the interferometry system, and using the measured deviation to correct subsequent measurements.

The amount a pair of measurement axes deviates from being parallel can be determined using a variety of techniques. For example, in some embodiments, one can measure the distance between interferometer beams at different positions along a measurement axis. The deviation of the measurement axes from being parallel can then be determined from the amount the measured distance between the beams changes at the different positions. Alternatively, or additionally, the relative position of the measurement axes can be measured interferometrically at different locations along the measurement axes. Deviation of the axes can then be calculated from the change in distance between them at the different locations.

Misalignment of the measurement axes can be represented by an error term, which accounts for the contribution of the misalignment in a mathematical equation relating a degree of freedom of the stage to the interferometric phase monitored using the interferometry system. The error term can also include contributions from other sources of error in the interferometry system, such as geometric errors associated with imperfections in the measurement object and/or non-cyclic errors associated with the interferometry system components.

For example, imperfections in a surface of a measurement object of the interferometry system can give rise to geometric non-cyclic errors, which refers to errors that occur as a result of a deviation of one or more of the interferometry system beams deviating from a nominal path. These deviations cause an optical path length between the deviating beam and another beam to vary from an optical path length corresponding to a perfect measurement object. Where such errors arise, using the relationship in Equation (2) to determine L from the measured phase can provide erroneous results, which can be detrimental in applications demanding a high level of precision. Furthermore, effects of such beam path deviations are heightened where L is comparatively large (e.g., about 0.5 m or more) because the contribution of a beam path deviation to the optical path difference typically scales with L.

In an interferometry system using multiple pass interferometers (e.g., double pass interferometers), a compensation scheme that accounts for geometric non-cyclic errors associated with imperfections in the measurement object should account for imperfections at each location of the measurement object that is contacted by an interferometer beam. For example, in systems using a double pass interferometer and a plane mirror measurement object, compensation for mirror imperfections should account for imperfections at both mirror locations that are contacted by the interferometer measurement beam.

By accounting for imperfections at the locations on a mirror where a measurement beam strikes, a compensation scheme can account for mirror imperfections that cancel out each other's contribution to the phase measured by the interferometer. In contrast, a compensation scheme that accounts only for mirror imperfections at one location (e.g., along the measurement axis of the interferometer), for example, can provide erroneous compensation by failing to accommodate for variations between the imperfections at each contact location of an interferometer beam on the measurement object.

Imperfections in a measurement object can introduce a displacement of the measurement object from a nominal measurement object position. Alternatively, or additionally, variations in the slope of a surface in a measurement object can deflect an incident beam from a nominal beam path, which is the path the beam would follow in the absence of any imperfections in the measurement object. Moreover, to accurately compensate for imperfections in the measurement object, a compensation scheme should account for beam deflections both within and out of the plane of incidence (i.e., the plane defined by the nominal beam path and the measurement object surface normal).

Information about errors, such as errors associated with axis misalignment and errors in the figure of a mirror, can be determined while calibrating the interferometry system or prior to its use and/or during periods where the interferometry system is off-line. This precalibrated information can be provided with the interferometry system, and used by the system to correct measurements so that they account for the axis misalignment.

The predetermined information may be stored as a representation (e.g., a lookup table or a functional representation) in an electronic data storage medium (e.g., a memory chip or a disk), which is provided to the interferometry system's end user. A control algorithm that runs the interferometry system in its end use application accesses the information from the data storage medium, and compensates the interferometry measurement accordingly.

Compensation may be performed on-line in real time or off-line. Application of the methods may be used to isolate effects of other errors, such as non-cyclic errors due to wavefront errors and beam shear.

Interferometers using techniques disclosed herein may be used in lithography tools and beam writing systems.

Various aspects and features of the interferometry systems, devices that use interferometry systems, and methods for using interferometry systems are summarized below.

In general, in one aspect, the invention features a method that includes monitoring a position of a stage along a first measurement axis and a second measurement axis of a multi-axis interferometry system and determining a position of the stage with respect to another degree of freedom based on the monitored positions along the first and second axes and predetermined information about how the measurement axes deviate from being parallel to one another.

Embodiments of the method can include one or more of the following features and/or features of other aspects.

The degree of freedom of the stage can be an orientation angle of the stage. In some embodiments, the degree of freedom of the stage can be the position of the stage along a third axis parallel to but separate from the first and second measurement axes of the multi-axis interferometry system. The degree of freedom of the stage can correspond to the position of an artifact with respect to the third axis. The artifact can be an alignment mark on a wafer supported by the stage or an alignment mark on the stage itself. In some embodiments, the third axis corresponds to the position of an alignment scope positioned to locate an alignment mark on the stage.

The predetermined information can include information about a variation in a distance between the measurement axes. The predetermined information can include information about an initial distance, $d_1$, between the axes. The information about a variation in a distance between the measurement axes can include a relationship between the distance between the measurement axes and displacement of the stage along one of the measurement axes. In some embodiments, the information about a variation in a distance between the measurement axes includes a value corresponding to the rate of change of the distance between the measurement axes with respect to a position of the stage along one of the measurement axes.

The multi-axis interferometry system can produce an output beam including a phase related to an optical path difference between a path of a first beam and a path of a second beam, wherein the first beam contacts a measurement object associated with the stage at a first location and the first or second beam contacts the measurement object at a second location different from the first location, wherein the predetermined information accounts for contributions to the optical path difference caused by a deviation of the path of the first or second beam from a nominal beam path due to an imperfection of the measurement object at the first location and due to an imperfection of the measurement object at the second location. The predetermined information can account for contributions to the optical path difference caused by a deviation of the path of the first or second beam within a plane defined by the nominal beam path due to the imperfection of the measurement object at the first or second location. The predetermined information can account for contributions to the optical path difference caused by a deviation of the path of the first or second beam out of a plane defined by a nominal beam path due to the imperfection of the measurement object at the first or second location. The predetermined information can further account for contributions to the optical path difference caused by a deviation of the path of the first or second beam from the nominal beam path due to an imperfection in at least one optic of the interferometry system. The imperfection in at least one optic of the interferometer can include an imperfection in a surface of the optic or an imperfection in the bulk of the optic (e.g., an inhomogeneity in the material forming the optic). The predetermined information can further account for contributions to the optical path difference caused by a deviation of the path of the first or second beam from the nominal beam path due to an imperfection in a light source that causes an input beam derived from the light source to deviate from an input beam path to the interferometer.

The predetermined information can be stored as a representation in an electronic storage medium. The representation can include a lookup table and/or a functional representation.

The multi-axis interferometry system can include a single axis interferometers (e.g., more than one single axis interferometer) and/or a multi-axis interferometer.

In general, in a further aspect, the invention features a system that includes a multi-axis interferometry system configured to monitor a position of a stage along a first measurement axis and a second measurement axis and an electronic controller configured to determine a position of the stage with respect to another degree of freedom based on the monitored positions along the first and second axes and predetermined information about how the measurement axes deviate from being parallel to one another.

Embodiments of the system can include one ore more of the following features and/or features of other aspects. In some embodiments, the system can be configured to implement methods disclosed herein.

The multi-axis interferometry system can include one or more single axis interferometers. Alternatively, or additionally, the multi-axis interferometry system can include a multi-axis interferometer. The multi-axis interferometry system can be further configured to monitor a position of the stage along a third measurement axis perpendicular to the first measurement axis. The stage can be configured to support a wafer.

In general, in a further aspect, the invention features a method for determining a position of a stage with respect to at least one degree of freedom, the method includes monitoring a location, $x_1$, of the stage along a first measurement axis of a multi-axis interferometry system that produces an output beam comprising a phase related to an optical path difference between a path of a first beam and a path of a second beam, wherein the first beam contacts a measurement object associated with the stage at a first location and the first or second beam contacts the measurement object at a second location different from the first location, monitoring a location, $x_2$, of the stage along a second measurement axis of the multi-axis interferometry system, and determining the position of the stage with respect to the degree of freedom based on $x_1$, $x_2$, and a correction term $\psi_3$, wherein $\psi_3$ accounts for contributions to the optical path difference caused by a deviation of the path of the first or second beam from a nominal beam path due to an imperfection of the measurement object at the first location and due to an imperfection of the measurement object at the second location.

Embodiments of the methods can include the following feature and/or features of other aspects. $\psi_3$ can include predetermined information about how the measurement axes deviate from being parallel to one another.

In another aspect, the invention features a lithography system for use in fabricating integrated circuits on a wafer, the system including a stage for supporting the wafer, an illumination system for imaging spatially patterned radiation onto the wafer, a positioning system for adjusting the position of the stage relative to the imaged radiation, and the multi-axis interferometry system for monitoring the position of the wafer relative to the imaged radiation.

In a further aspect, the invention features a lithography system for use in fabricating integrated circuits on a wafer, the system including a stage for supporting the wafer, and an illumination system including a radiation source, a mask, a positioning system, a lens assembly, and the multi-axis interferometry system, wherein during operation the source directs radiation through the mask to produce spatially patterned radiation, the positioning system adjusts the position of the mask relative to the radiation from the source, the lens assembly images the spatially patterned radiation onto the wafer, and the multi-axis interferometry system monitors the position of the mask relative to the radiation from the source.

In another aspect, the invention features a beam writing system for use in fabricating a lithography mask, the system including a source providing a write beam to pattern a substrate, a stage supporting the substrate, a beam directing assembly for delivering the write beam to the substrate, a positioning system for positioning the stage and beam directing assembly relative one another; and the multi-axis interferometry system for monitoring the position of the stage relative to the beam directing assembly.

In a further aspect, the invention features a lithography method for use in fabricating integrated circuits on a wafer, the method including supporting the wafer on a moveable stage, imaging spatially patterned radiation onto the wafer, adjusting the position of the stage, and monitoring the position of the stage using a method of another aspect of the invention.

In another aspect, the invention features a lithography method for use in the fabrication of integrated circuits including directing input radiation through a mask to produce spatially patterned radiation, positioning the mask relative to the input radiation, monitoring the position of the mask relative to the input radiation using a method of another aspect of the invention, and imaging the spatially patterned radiation onto a wafer.

In a further aspect, the invention features a lithography method for fabricating integrated circuits on a wafer including positioning a first component of a lithography system relative to a second component of a lithography system to expose the wafer to spatially patterned radiation, and monitoring the position of the first component relative to the second component using a method of another aspect of the invention.

In another aspect, the invention features a method for fabricating integrated circuits, the method including a foregoing lithography method.

In a further aspect, the invention features a method for fabricating integrated circuits, the method including using a foregoing lithography system.

In another aspect, the invention features a method for fabricating a lithography mask, the method including directing a write beam to a substrate to pattern the substrate, positioning the substrate relative to the write beam, and monitoring the position of the substrate relative to the write beam using a method of another aspect of the invention.

Embodiments of the interferometry systems and methods can include one or more of the following advantages. Characterizing interferometry system axis misalignment using the methods and systems disclosed herein can be used to improve interferometry system accuracy in end-use applications. Accuracy improvement comes from compensating for contributions of axis misalignment when determining a degree of freedom (e.g., a displacement or angular orientation) of a measurement object from measured interference phases. This also can allow for the use of interferometry systems in high precision applications where imperfections causing beam path deviations would otherwise render the interferometry system too inaccurate. Accordingly, interferometry systems can be used in applications that would otherwise require higher quality components to provide a desired level of accuracy. Because lesser quality components are typically cheaper than high quality counterparts, the methods and systems can provide a cost savings.

Unless otherwise defined, all technical and scientific terms used herein have the same meaning as commonly understood by one of ordinary skill in the art to which this invention belongs. In case of conflict with publications, patent applications, patents, and other references incorporated herein by reference, the present specification, including definitions, will control.

BRIEF DESCRIPTION OF THE FIGURES

Like reference symbols in the various drawings indicate like elements.

DETAILED DESCRIPTION

Figure 1:
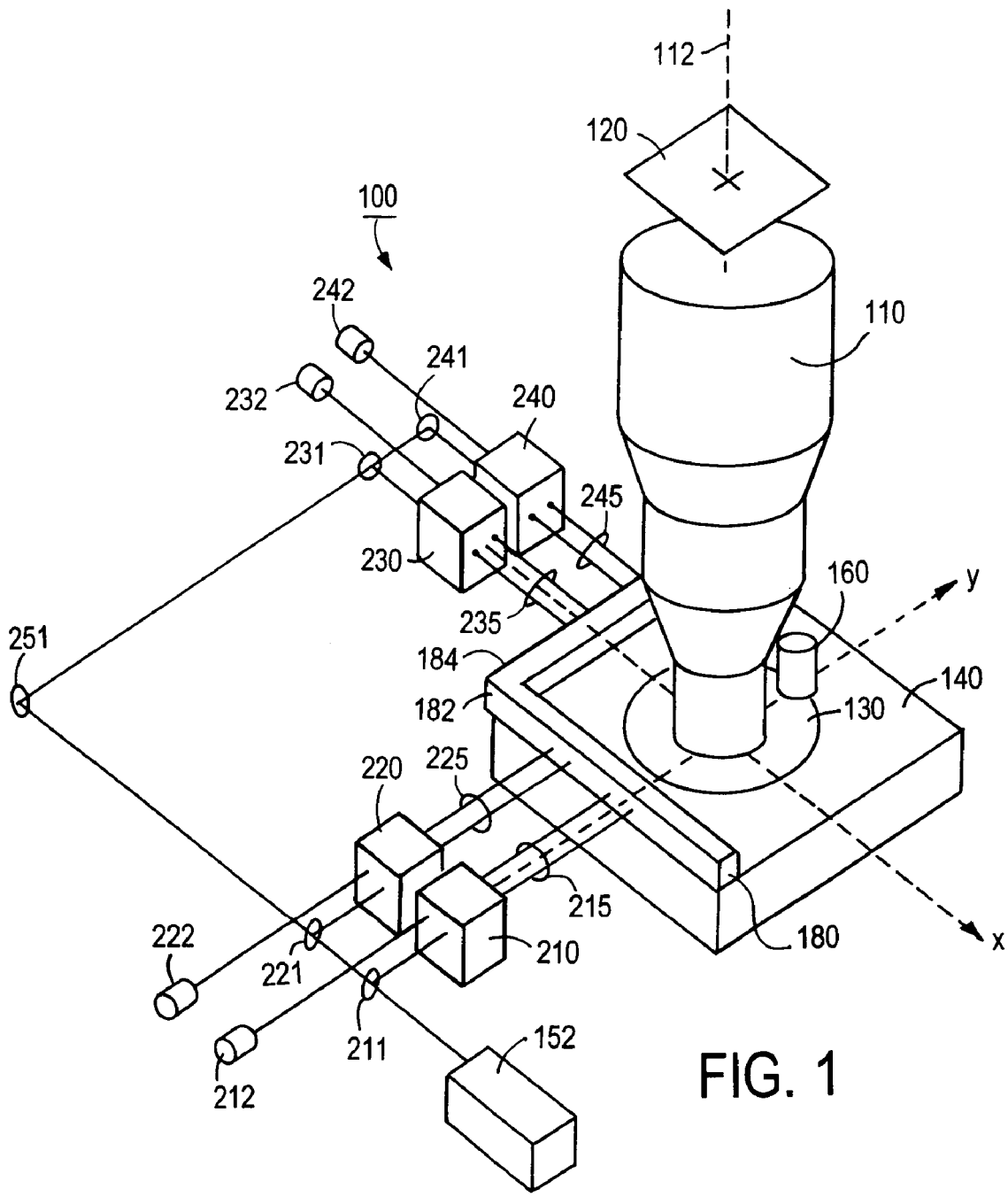
FIG. 1 is a perspective view of an embodiment of a lithography tool.
Figure 2:
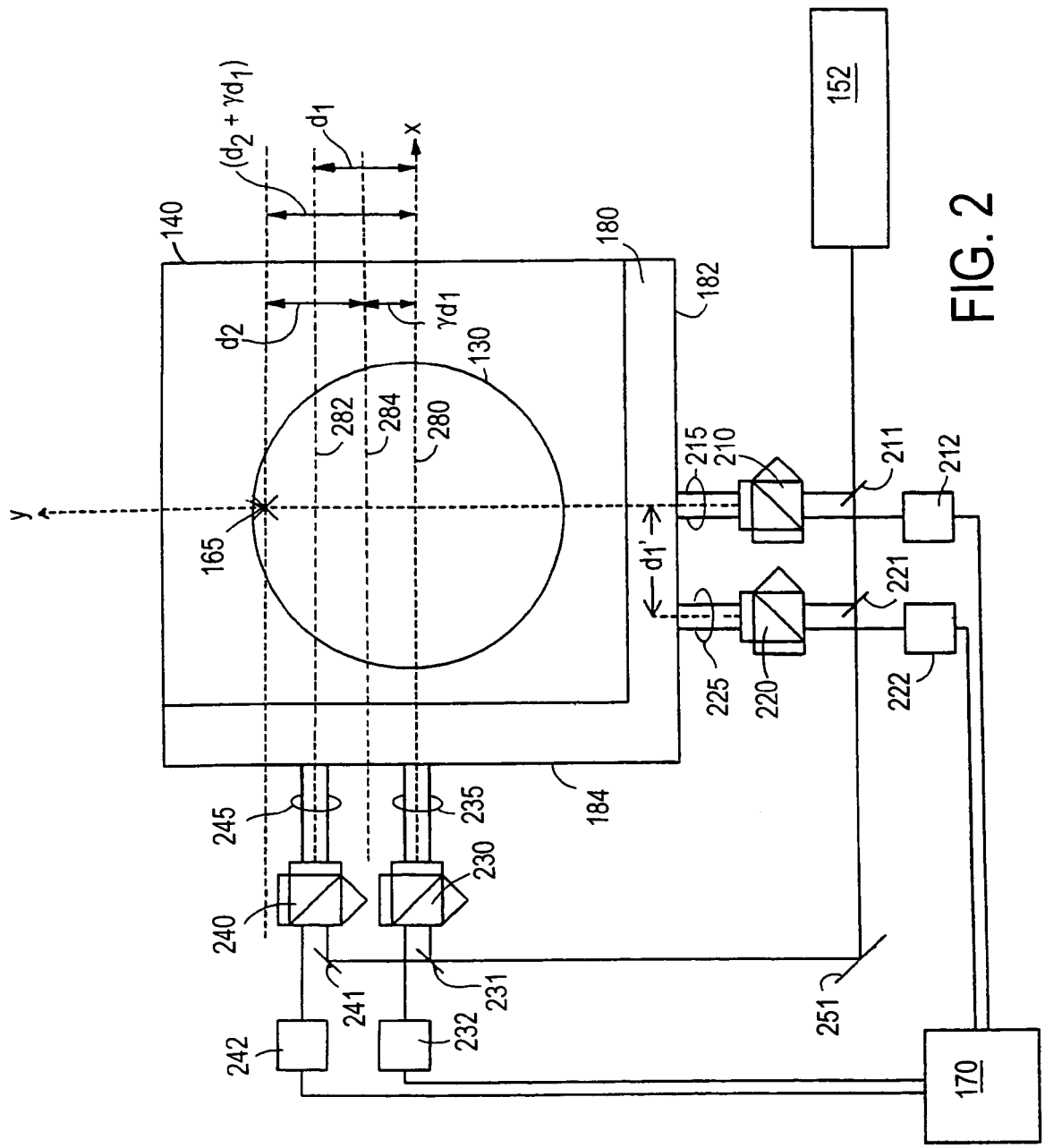
FIG. 2 is a plan view of the stage and interferometry system of the lithography tool shown in FIG. 1.

Referring to FIG. 1 and FIG. 2, a lithography tool 100 includes an exposure system 110 positioned to image a reticle 120 onto an exposure region 135 of a wafer 130. Wafer 130 is supported by a stage 140, which scans wafer 130 in a plane orthogonal to an axis 112 of exposure system 110. A stage mirror 180 is mounted on stage 140. Stage mirror 180 includes two nominally orthogonal reflecting surfaces 182 and 184.

A multi-axis interferometry system monitors the position of stage 140 along orthogonal x- and y-measurement axes. The x- and y-axes intersect with axis 112 of exposure system 110. The interferometry system includes four interferometers 210, 220, 230, and 240. Interferometers 210 and 220 respectively direct measurement beams 215 and 225 parallel to they-axis to reflect from mirror surface 182. Similarly, interferometers 230 and 240 respectively direct measurement beams 235 and 245 parallel to the x-axis to reflect twice from mirror surface 184. After reflection from the mirror surfaces, each measurement beam is combined with a reference beam to form an output beam. A phase of each output beam is related to the optical path length difference between the measurement and reference beam paths. Detectors 212, 222, 232, and 242 detect the output beams from interferometers 210, 220, 230, and 240, respectively, to generate electrical interference signals and communicate optical path length difference information and information about local slopes of reflecting surfaces 184 and 182 to an electronic controller 170, which determines the stage position and angular orientation from the information and adjusts the position and angular orientation of stage 140 relative to exposure system 110 and reticle 120 accordingly.

The input beam for each interferometer is derived from a common source, laser light source 152. Beam splitters 211, 221, 231, and mirrors 241 and 251 direct light from light source 152 to the interferometers. Each interferometer splits its input beam into a measurement beam and a reference beam. In the present embodiment, each interferometer directs its respective measurement beam along a path that contacts a surface of mirror 180 twice.

Interferometers 230 and 210 monitor co-ordinates $x_1$ and $y_1$ of the location of mirror surfaces 184 and 182 along the x- and y-axes, respectively. Additionally, interferometers 240 and 220 monitor the location of stage 140 along a second set of axes, offset from but nominally parallel to the x- and y-axes, respectively. The secondary measurements provide co-ordinates $x_2$ and $y_2$ of mirror surfaces 184 and 182, respectively. The separations of these secondary measurement axes from the x- and y-axes are indicated as $d_1$ and $d'_1$ in FIG. 2. The measurement axes of interferometers 230 and 240 are labeled as axes 280 and 282, respectively.

Interferometers 230 and 240 respectively monitor $x_1$ and $x_2$ along interferometer axes 280 and 282, which are separated by distance $d_1$. Ideally, $d_1$ is constant for different positions for stage 140 along axis 280. However, in some embodiments, distance $\tilde{d}_1$ varies as a function of $x_1$.

In the present embodiment, exposure system 110 is positioned with axis 112 coincident with axis 280, which corresponds to the x-axis. Accordingly, $x_1$ corresponds to the stage's position along the x-axis. In some embodiments, measurements of $x_1$ and $x_2$ can be used to determine the position of stage 140 along a user defined axis between axis 280 and axis 282. For example, in embodiments where the exposure system is positioned with its optical axis midway between interferometer axes 280 and 282, the stage position can be determined along a measurement axis midway between interferometer axes 280 and 282 as $$x' = \frac{1}{2}(x_1 + x_2).$$

More generally, the stage position can be determined on a measurement axis 284 separated from axis 280 by $\Gamma d_1$ according to the formula $$x_{1+\Gamma} = (1-\Gamma)x_1 + \Gamma x_2 \quad (4)$$

where $d_1$ is a nominal value of $\tilde{d}_1$, e.g., the value of $\tilde{d}_1$ at an initial position along axis 280, such as for $x_1=0$.

Lithography tool 100 also includes an alignment scope 160, positioned off-axis from axis 112. Alignment scope 160 is positioned to locate objects at a position on the) y-axis, offset from the x-axis (corresponding to axis 280) by an amount $d_2+\Gamma d_1$, where $d_2$ is the separation between axis 284 and another axis 286, parallel to the x-axis, on which the alignment scope is located. In the present embodiment, a user locates an alignment mark 165 with alignment scope 160. Because the position of alignment scope 160 with respect to exposure system 110 and the x- and y-axes is known through a calibrating procedure, locating the alignment mark 165 with the scope registers the alignment mark with respect to the exposure system. The values of $x_1$, $x_2$, $y_1$, and $y_2$ that are measured once the user has located alignment mark 165 provide a set of reference co-ordinates indicative of the alignment mark's location on the stage. Based on these reference co-ordinates, the user can accurately translate the wafer on the stage with respect to the exposure system to locate target regions of the wafer on axis 112.

Figure 3:
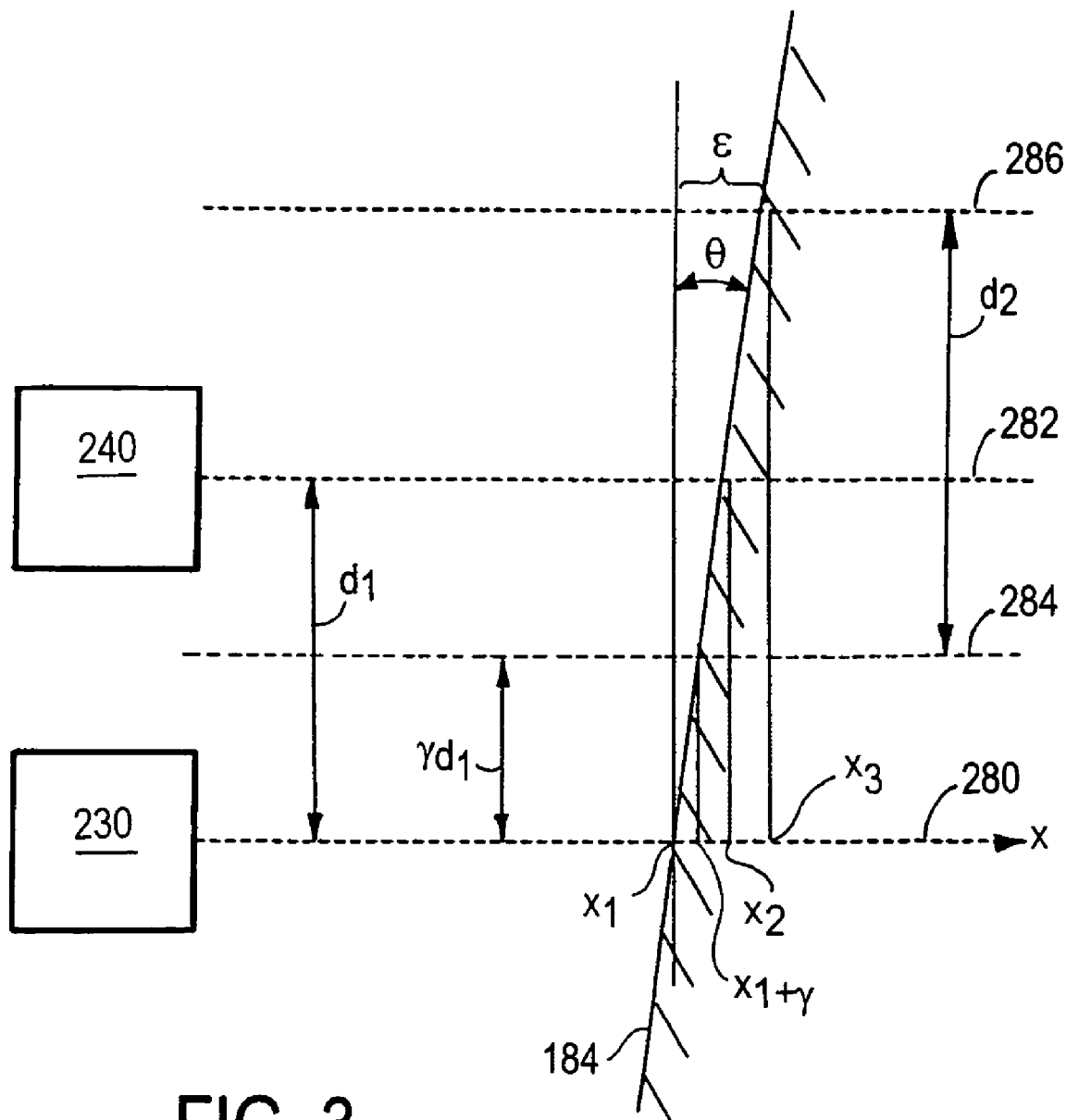
FIG. 3 is a schematic of a high stability plane mirror interferometer.

Any repositioning of the stage based on the reference co-ordinates should account for the angular orientation of the stage when alignment mark 165 is located by alignment scope 160. The effect of stage orientation is illustrated in FIG. 3, which shows axes 280 and 282, measurement axis 284, and axis 286. The location of a position along axis 286 is denoted as $x_3$. Note that $x_3$ is the location of a position along axis 286 in a coordinate system based on $x_1$, $x_2$, and the angular orientation of the stage. Where the orientation angle, $\theta_{2,1}$, of the stage is zero, $x_1=x_2=x_3$. However, for non-zero values of $\theta_{2,1}$, $x_3-x_{1+\Gamma}=\eta d_1 \tan \theta_{2,1}=\epsilon$ where $\eta=d_2/d_1$. The offset, $\epsilon$, is referred to as the Abbé offset error.

Interferometers 230 and 240 introduce phase shifts $\tilde{\phi}_1$ and $\tilde{\phi}_2$ between the measurement and reference beams of interferometers. Detectors 232 and 242 detect the output beams from interferometers 230 and 240, respectively, and generate displacement electrical interference signals. The electrical interference signals are processed by electronic controller 170 to provide measurement of phase shifts $\tilde{\phi}_1$ and $\tilde{\phi}_2$.

Phase shifts $\tilde{\phi}_1$ and $\tilde{\phi}_2$ are derived from the electrical interference signals by processor 170 by known techniques used in processing heterodyne signals for phase information. The processing is by either digital or analog signal processes, using, for example, time-based phase detection such as a digital Hilbert transform phase detector (see, e.g., section 4.1.1 of "Phase-locked loops: theory, design, and applications" 2nd ed. McGraw-Hill (New York) 1993, by R. E. Best) or sliding window finite Fourier transform (FFT) techniques.

The magnitude of phase shifts $\tilde{\phi}_1$ and $\tilde{\phi}_2$ are related to measured displacements $\tilde{x}_1$ and $\tilde{x}_2$, respectively, of mirror 184 along axis 280 and 282, respectively, according to the formulae $$\tilde{\phi}_i = 4kn\tilde{x}_i, \; i=1 \text{ and } 2, \quad (5)$$

where $\tilde{x}_i$ is the measured difference in displacements of the measurement and reference paths for interferometer i for interferometer 10; n is an average index of refraction for the difference between the measurement and reference paths; wavenumber $k=2\pi/\lambda$; and $\lambda$ is the wavelength of the measurement beams. Note that subscript i=1 refers to parameters related to interferometer 230, and subscript i=2 refers to parameters related to interferometer 240. The measured difference in displacements is $$\tilde{x}_i = x_i + \psi_i \quad (6)$$

where $\psi_i$ is the effect of non-cyclic errors and $x_i$ is the difference in physical path lengths of the measurement and reference beams for reflecting surface 184 of mirror 180 replaced by a reflecting reference measurement object surface. Accordingly, where $\psi_i$ is negligible or otherwise known, the actual path length, $x_i$, can be determined from the measured phase, $\tilde{\phi}_i$. The reflecting reference measurement object surface is a plane mirror and is based on measured properties of reflecting surface 184.

The measured changes in orientation $\tilde{\theta}_{2,1}$ of mirror surface 184 based on measured linear displacement measurements is determined by processor 170 according to the formula $$\tilde{\theta}_{2,1} = \tan^{-1}\left[\frac{(\tilde{\varphi}_2 - \tilde{\varphi}_1)}{4knd_1}\right]. \quad (7)$$

The change in orientation $\theta_{2,1}$ of mirror surface 184 obtained using information from interferometers 230 and 240, where $\psi_i$ is negligible or otherwise compensated for, is given by the formula $$\theta_{2,1} = \tan^{-1}\left[\frac{(x_2 - x_1)}{\tilde{d}_1}\right]. \quad (8)$$

In some embodiments, $\tilde{d}_1$ can be determined according to the formula $$\tilde{d}_1 = d_1 + \frac{\partial \tilde{d}_1}{\partial x_1}(x_1 + \xi_i); \quad (9)$$

Here, $\xi_i$ is a physical change in the path of a measurement beam of interferometer i due to errors in the figure of reflecting surface 184.

The effect of non-cyclic error $\psi_i$ on the measured value $\tilde{\theta}_{2,1}$ is evident on combining Equations (5), (6), (7), (8), and (9), with the result $$\tilde{\theta}_{2,1} = \theta_{2,1} + \frac{x_2 - x_1}{d_1} + \frac{\psi_2 - \psi_1}{d_1} - \frac{x_2 - x_1}{d_1} \frac{1}{1 + \frac{\partial \tilde{d}_1}{d_1 \partial x_1}(x_1 + \xi_1)}. \quad (10)$$

Retaining only the first order terms of $\tan^{-1} \rho$, Equation (10) can be written as $$\tilde{\theta}_{2,1} = \quad (11)$$

$$\theta_{2,1} + \left[ \frac{(x_2 - x_1)}{d_1} \left( \frac{\partial \tilde{d}_1}{d_1 \partial x_1} \right) \frac{(x_1 + \xi_1)}{1 + \left( \frac{\partial \tilde{d}_1}{d_1 \partial x_1} \right)(x_1 + \xi_1)} + \frac{(\psi_2 - \psi_1)}{d_1} \right]$$

Higher order terms may be retained as desired in an end use application.

Sources of non-cyclic errors include the contribution to the optical path difference $\zeta_i$ due to imperfections in interferometer i. The measured displacements $\tilde{x}_i$ compensated for non-cyclic errors $\xi_i$ and $\zeta_i$ and the leading term of geometrical effects encountered, for example, in a plane mirror interferometer, e.g., an HSPMI, are expressed as $x_i$ $$x_i = \tilde{x}_i - \left[ \xi_i + \zeta_i - (x_i + \xi_i + x_{i,0})\rho_{2,1} \left\{ \begin{array}{c} \tilde{\theta}_{2,1} - \delta\theta_{2,1} - \\ \Delta\theta_{2,1} - \frac{1}{2}\left[\frac{\partial(\xi_{i,2} - \xi_{i,1})}{\partial y}\right] \end{array} \right\}^2 \right] \quad (12)$$

where $\xi_{i,1}$ and $\xi_{i,2}$ are the errors in the figure of reflecting surface 184 at the locations contacted by first and second pass measurement beams, respectively, for the measurement axis of interferometer i, $(x_i + \xi_i + x_{i,0})$ is the effective distance from the nodal point of a respective retroreflector and reflecting surface 184, $x_{i,0}$ is an initial position for $x_i$, such as $x_i = 0$. $\rho_{2,1}$ is a scale factor arising from misalignment of beams (see below), $\Delta\theta_{2,1}$ is a correction arising from misalignment of beams, and $$\delta\theta_{2,1} = \tilde{\theta}_{2,1} - \theta_{2,1}. \quad (13)$$

The scale factor $\rho_{2,1}$ and correction $\Delta\theta_{2,1}$ can be given by the following equations $$\rho_{2,1} = 1 - \frac{1}{4}\left(\alpha_x + \frac{\beta_x}{2} - \frac{\delta_x}{2}\right)^2 - \frac{1}{4}\left(\alpha_y + \frac{\beta_y}{2} - \frac{\delta_y}{2}\right)^2 - \quad (14)$$

$$\frac{1}{8}(\beta_x^2 + \beta_y^2) + \frac{1}{8}(\delta_x^2 + \delta_y^2) \ldots ,$$

$$\Delta\theta_{2,1} = -\frac{1}{2}\left(\alpha_x + \frac{\beta_x}{2} - \frac{\delta_x}{2}\right), \quad (15)$$

where $\alpha_x$ and $\alpha_y$ are deviations in the direction of the input beam with respect to the interferometer measurement axis in the x-z and y-z planes, respectively; $\beta_x$ and $\beta_y$ are deviations in the direction of the component of second pass measurement beam propagating toward reflective surface 184 with respect to the direction of propagation of the component of the first pass measurement beam propagating toward interferometer 230 in the x-z and y-z planes, respectively; and $\delta_x$ and $\delta_y$ are deviations in the direction of the measurement beam component with respect to the direction of the reference beam component of output beam of interferometer 230 in the x-z and y-z planes, respectively, with $\alpha_x = \alpha_y = 0$, $\beta_x = \beta_y = 0$, and $\theta_{x1} = \theta_{x2} = \theta_{y1} = \theta_{y2} = 0$. For further description of the compensation of effects of misalignment of beams and geometric effects, see, for example, U.S. patent application Ser. No. 10/872,304, entitled "COMPENSATION FOR GEOMETRIC EFFECTS OF BEAM MISALIGNMENTS IN PLANE MIRROR INTERFEROMETER METROLOGY SYSTEMS," filed on Jun. 18, 2004, the entire contents of which is hereby incorporated by reference.

The effects of non-cyclic errors on the measured value $\tilde{\theta}_{2,1}$ are represented in the equation $$\tilde{\theta}_{2,1} = \theta_{2,1} + \frac{1}{d_1}[(\xi_2 - \xi_1) + (\zeta_2 - \zeta_1)] + \frac{1}{d_1}\left(\frac{\partial \tilde{d}_1}{d_1 \partial x_1}\right) \frac{(x_1 + \xi_1)}{1 + \left(\frac{\partial \tilde{d}_1}{d_1 \partial x_1}\right)(x_1 + \xi_1)} \times \quad (16)$$

$$\left[ \begin{array}{c} (\tilde{x}_2 - \tilde{x}_1) - (\xi_2 - \xi_1) - (\zeta_2 - \zeta_1) + \\ (x_2 + \xi_2 + x_{20})\rho_{2,1}\left\{\tilde{\theta}_{2,1} - \delta\theta_{2,1} - \Delta\theta_{2,1} - \frac{1}{2}\left[\frac{\partial(\xi_{2,2} - \xi_{2,1})}{\partial y}\right]\right\}^2 - \\ (x_1 + \xi_1 + x_{10})\rho_{2,1}\left\{\tilde{\theta}_{2,1} - \delta\theta_{2,1} - \Delta\theta_{2,1} - \frac{1}{2}\left[\frac{\partial(\xi_{1,2} - \xi_{1,1})}{\partial y}\right]\right\}^2 \end{array} \right]$$

by the combination of Equations (11), (12), and (13). Equations corresponding to Equation (16) can be expressed using other measured values for changes in orientation of stage 140, such as from measurements made using interferometers 210 and 220.

From Equations (13) and (16), the following expression for the effect of non-cyclic errors $\delta\theta_{2,1}$ is obtained:

$$\delta\vartheta_{2,1} = \frac{1}{d_1}[(\xi_2 - \xi_1) + (\zeta_2 - \zeta_1)]\left[1 - \frac{1}{d_1}\left(\frac{\partial \tilde{d}_1}{d_1 \partial x_1}\right)\frac{(x_1 + \xi_1)}{1 + \left(\frac{\partial \tilde{d}_1}{d_1 \partial x_1}\right)(x_1 + \xi_1)}\right] + \quad (17)$$

$$\frac{1}{d_1}\left(\frac{\partial \tilde{d}_1}{d_1 \partial x_1}\right)\frac{(x_1 + \xi_1)}{1 + \left(\frac{\partial \tilde{d}_1}{d_1 \partial x_1}\right)(x_1 + \xi_1)} \times \left|\begin{array}{l}(\tilde{x}_2 - \tilde{x}_1) + (x_2 + \xi_2 + x_{2,0})\rho_{2,1}\left\{\tilde{\vartheta}_{2,1} - \delta\vartheta_{2,1} - \Delta\vartheta_{2,1} - \frac{1}{2}\left[\frac{\partial(\xi_{2,2} - \xi_{2,1})}{\partial y}\right]\right\}^2 - \\ (x_1 + \xi_1 + x_{1,0})\rho_{2,1}\left\{\tilde{\vartheta}_{2,1} - \delta\vartheta_{2,1} - \Delta\vartheta_{2,1} - \frac{1}{2}\left[\frac{\partial(\xi_{1,2} - \xi_{1,1})}{\partial y}\right]\right\}^2\end{array}\right|.$$

Equation (17) is a quadratic equation in $\delta\vartheta_{2,1} = (\tilde{\vartheta}_{2,1} - \vartheta_{2,1})$. In cases where the term quadratic in $\delta\vartheta_{2,1}$ can be neglected (e.g., where $\delta\vartheta_{2,1} \ll \tilde{\vartheta}_{2,1}$), Equation (17) can be solved for $\delta\vartheta_{2,1}$ as $$\delta\vartheta_{2,1} = \left\{\left\{\frac{1}{d_1}[(\xi_2 - \xi_1) + (\zeta_2 - \zeta_1)]\left[1 - \frac{1}{d_1}\left(\frac{\partial \tilde{d}_1}{d_1 \partial x_1}\right)\frac{(x_1 + \xi_1)}{1 + \left(\frac{\partial \tilde{d}_1}{d_1 \partial x_1}\right)(x_1 + \xi_1)}\right] + \right.\right. \quad (18)$$

$$\left.\frac{1}{d_1}\left(\frac{\partial \tilde{d}_1}{d_1 \partial x_1}\right)\frac{(x_1 + \xi_1)}{1 + \left(\frac{\partial \tilde{d}_1}{d_1 \partial x_1}\right)(x_1 + \xi_1)} \times \left|\begin{array}{l}(\tilde{x}_2 - \tilde{x}_1) + \\ [(x_2 + \xi_2 + x_{2,0}) - (x_1 + \xi_1 + x_{1,0})]\rho_{2,1}\end{array}\left\{\begin{array}{l}\tilde{\vartheta}_{2,1} - \Delta\vartheta_{2,1} - \\ \frac{1}{2}\left[\frac{\partial(\xi_{1,2} - \xi_{1,1})}{\partial y}\right]\end{array}\right\}^2\right|\right\} \times$$

$$\left.\left|1 - \frac{1}{d_1}\left(\frac{\partial \tilde{d}_1}{d_1 \partial x_1}\right)\frac{2(x_1 + \xi_1)}{1 + \left(\frac{\partial \tilde{d}_1}{d_1 \partial x_1}\right)(x_1 + \xi_1)}\rho_{2,1} \times [(x_2 + \xi_2 + x_{2,0}) - (x_1 + \xi_1 + x_{1,0})]\left\{\begin{array}{l}\tilde{\vartheta}_{2,1} - \Delta\vartheta_{2,1} - \\ \frac{1}{2}\left[\frac{\partial(\xi_{1,2} - \xi_{1,1})}{\partial y}\right]\end{array}\right\}\right|\right..$$

The linear displacement $x_3$ can be determined from $$x_3 = (1 - \Gamma)\tilde{x}_1 + \Gamma\tilde{x}_2 + d_2\tilde{\vartheta}_{2,1} - [(1 - \Gamma)\psi_1 + \Gamma\psi_2] - d_2\delta\vartheta_{2,1} \quad (19)$$

or $$x_3 = x_{1+\Gamma} + d_2\tilde{\vartheta} - \psi_3 \quad (20)$$

$$= (1 - \Gamma)\tilde{x}_1 + \Gamma\tilde{x}_2 + d_2\tilde{\vartheta} - \psi_3$$

where $$\psi_3 = [(1 - \Gamma)\psi_1 + \Gamma\psi_2] + d_2\delta\vartheta_{2,1}. \quad (21)$$

The linear displacement $x_3$ and error correction term $\psi_3$ given by Equations (19) and (20), respectively, may be written in terms of differential mode components of linear displacement and of error correction terms (i.e., $(x_2-x_1)$ and $(\psi_2-\psi_1)$), and common mode components of linear displacement and of error correction terms (i.e., $(x_2+x_1)$ and $(\psi_2+\psi_1)$), in order to more easily establish correspondence with available measured quantities. The corresponding equations are $$x_3 = \left(\frac{1}{2}\right)(\tilde{x}_2 + \tilde{x}_1) + \left(\Gamma - \frac{1}{2}\right)(\tilde{x}_2 - \tilde{x}_1) + d_2\tilde{\vartheta}_{2,1} - \quad (22)$$

$$\left(\eta + \Gamma - \frac{1}{2}\right)(\psi_2 - \psi_1) - \frac{1}{2}(\psi_2 + \psi_1),$$

$$\psi_3 = \left(\eta + \Gamma - \frac{1}{2}\right)(\psi_2 - \psi_1) + \frac{1}{2}(\psi_s + \psi_1) \quad (23)$$

where $\Gamma$ is selected according to an end use application and $\eta = d_2/d_1$. It is evident on inspection of Equation (21) that the effects of non-cyclic errors in off-axis alignment mark determinations are statistically approximately $\sqrt{2}(d_2/d_1)$ times larger than the effects of non-cyclic errors in a displacement measurement made by a single linear displacement interferometer.

The term $(\xi_1+\zeta_1)$ can be expressed in terms of the average or common error $[(\xi_2+\xi_1)+(\zeta_2+\zeta_1)]/2$ and the difference error $[(\xi_2-\xi_1)+(\zeta_2-\zeta_1)]/2$ such that the following equations for $x_{1+\Gamma}$ and $x_3$ are obtained:

$$\tilde{x}_{1+\Gamma} = \tilde{x}_1 + (x_1 + \xi_1 + x_{10})\rho_{2,1}\left\{\tilde{\vartheta}_{2,1} - \Delta\vartheta_{2,1} - \delta\vartheta_{2,1} - \frac{1}{2}\left[\frac{\partial(\xi_{1,2} - \xi_{1,1})}{\partial y}\right]\right\}^2 + \Gamma(\tilde{x}_2 - \tilde{x}_1)(\tilde{\vartheta} - \delta\vartheta_{2,1}) - \frac{1}{2}[(\xi_2 + \xi_1) + (\zeta_2 + \zeta_1)] - \quad (24)$$

$$\Gamma[(\xi_2 - \xi_1) + (\zeta_2 - \zeta_1)] - \left\{\Gamma\left[1 - \left(\frac{\partial \tilde{d}_1}{d_1 \partial x_1}\right)x_1\right] - \frac{1}{2}\right\} - \rho_{2,1}\Gamma\left[1 - \left(\frac{\partial \tilde{d}_1}{d_1 x_1}\right)x_1\right] \times \begin{bmatrix} (x_2 + \xi_2 + x_{2,0})\left\{\tilde{\vartheta}_{2,1} - \Delta\vartheta_{2,1} - \delta\vartheta_{2,1} - \frac{1}{2}\left[\frac{\partial(\xi_{2,2} - \xi_{2,1})}{\partial y}\right]\right\}^2 - \\ (x_1 + \xi_1 + x_{1,0})\left\{\tilde{\vartheta}_{2,1} - \Delta\vartheta_{2,1} - \delta\vartheta_{2,1} - \frac{1}{2}\left[\frac{\partial(\xi_{1,2} - \xi_{1,1})}{\partial y}\right]\right\}^2 \end{bmatrix},$$

$$x_3 = \tilde{x}_1 + (x_1 + \xi_1 + x_{1,0})\rho_{2,1}\left\{\tilde{\vartheta}_{2,1} - \Delta\vartheta_{2,1} - \delta\vartheta_{2,1} - \frac{1}{2}\left[\frac{\partial(\xi_{1,2} - \xi_{1,1})}{\partial y}\right]\right\}^2 + [d + \Gamma(\tilde{x}_2 - \tilde{x}_1)]\vartheta_{2,1} - \quad (25)$$

$$\delta\vartheta_{2,1}d_2 - \frac{1}{2}[(\xi_2 + \xi_1) + (\zeta_2 + \zeta_1)] - [(\xi_2 - \xi_1) + (\zeta_2 - \zeta_1)]\left\{\Gamma\left[1 - \left(\frac{\partial \tilde{d}_1}{d_1 \partial x_1}\right)x_1\right] - \frac{1}{2}\right\} -$$

$$\Gamma\rho_{2,1}\left[1 - \left(\frac{\partial \tilde{d}_1}{d_1 \partial x_1}\right)x_1\right] \times \begin{bmatrix} (x_2 + \xi_2 + x_{2,0})\left\{\tilde{\vartheta}_{2,1} - \Delta\vartheta_{2,1} - \delta\vartheta_{2,1} - \frac{1}{2}\left[\frac{\partial(\xi_{2,2} - \xi_{2,1})}{\partial y}\right]\right\}^2 - \\ (x_1 + \xi_1 + x_{1,0})\left\{\tilde{\vartheta}_{2,1} - \Delta\vartheta_{2,1} - \delta\vartheta_{2,1} - \frac{1}{2}\left[\frac{\partial(\xi_{1,2} - \xi_{1,1})}{\partial y}\right]\right\}^2 \end{bmatrix}.$$

It is evident on examination of Equations (24) and (25) that a number of different parameters or constants of the interferometry system should be known in addition to the errors such as represented by $[(\xi_2 - \xi_1) + (\zeta_2 - \zeta_1)]$, $[(\xi_2 + \xi_1) + (\zeta_2 + \zeta_1)]$, $\partial(\xi_{1,2} - \xi_{1,1})/\partial y$, and $\partial(\xi_{2,2} - \xi_{2,1})/\partial y$ in order to make corrections for effects of non-cyclic errors in a position $x_{1+\Gamma}$, in a position displaced off-axis such as $x_3$, and corresponding on-axis positions determined by interferometers 230 and 240. The different parameters include, for example, $d_2$, $d_1$, $(\partial\tilde{d}_1)/(d_1\partial x_1)$, $\Gamma$, $x_{1,0}$, $x_{2,0}$, $\alpha_x$, $\alpha_y$, $\beta_x$, $\beta_y$, $\gamma_x$, and $\gamma_y$.

Parameters such as $d_2$, $d_1$, $\Gamma$, $x_{1,0}$, and $x_{2,0}$ can be measured directly from the geometry of the interferometry system and/or lithography tool. $d_1$, $d_2$, and $\Gamma$ can be determined during installation of various components of the lithography tool, for example. These parameters can be measured directly, e.g., using a meter stick or caliper. Parameters $x_{1,0}$ and $x_{2,0}$ can be measured during initialization of the interferometry system.

In general, the accuracy to which these parameters needs to be known to allow for a desired level of compensation of interferometry system measurements on varies depending a desired level of accuracy of the interferometry measurements. In some embodiments, these parameters should be known to about the nearest mm or less (e.g., about 0.1 mm or less, 0.01 mm or less).

Techniques for measuring parameters such as $(\partial \tilde{d}_1)/(d_1 \partial x_1)$, $\alpha_x$, $\alpha_y$, $\beta_x$, $\beta_y$, $\gamma_x$, and $\gamma_y$ are discussed below.

Controller 170 calculates values for measured degrees of freedom of stage 140 (e.g., quantities $\tilde{x}_{1+\Gamma}$, $\tilde{\theta}_{2,1}$, and $\tilde{x}_3$), compensating the calculated values for the effects of the non-cyclic errors. Where the measured degrees of freedom are used as feedback to control the motion of stage 140, controller 170 can compensate the measured degrees of freedom prior to adjusting the position of stage 140 to avoid compounding the errors by transferring them to the position of the stage.

Figure 4:
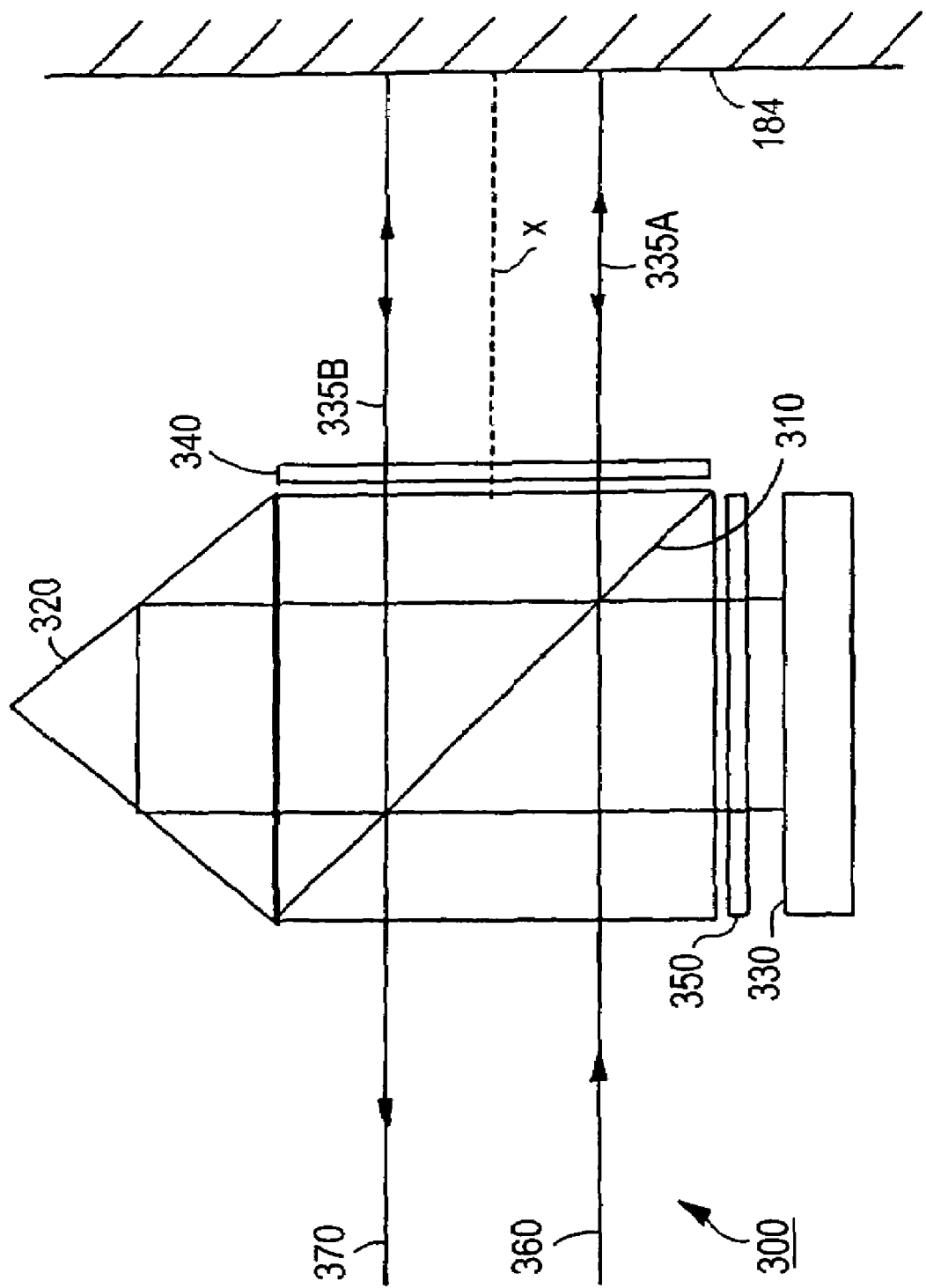
FIG. 4 is a schematic showing an Abbé offset error.

In general, the type of interferometer used in tool 100 can vary. In some embodiments, interferometers 210, 220, 230, and 240 are high stability plane mirror interferometers (HSPMIs). Referring to FIG. 4, an HSMPI 300 includes a polarizing beam splitter (PBS) 310, a retroreflector 320, and a reference mirror 330. HSPMI 300 also includes quarter wave plates 340 and 350, positioned between PBS 310 and mirror surface 184 or reference mirror 330, respectively. For interferometers 230 and 210, a first portion of respective output beams are transmitted by non-polarizing beam splitters and subsequently detected to obtain information about the location of reflective surfaces 184 and 182, respectively.

During operation, PBS 310 splits the input beam, indicated as beam 360 in FIG. 3, into orthogonally polarized components. One component, measurement beam 335A, is transmitted by PBS 310 and reflects from mirror surface 184 back towards PBS 310. On its return to PBS 310, the polarization state of the measurement beam is now orthogonal to its original polarization state due to the passing through quarter wave plate 340 twice, and the measurement beam is reflected by PBS 310 towards retroreflector 320. Retroreflector 320 directs the measurement beam back towards PBS 310, which reflects the measurement beam towards mirror surface 184. On the second pass to mirror surface 184, the measurement beam is indicated as beam 335B. Again, mirror surface 184 reflects beam 335B towards PBS 310. The double pass through quarter wave plate 340 transforms the polarization state of the measurement beam back to its original state, and it is transmitted by PBS 310 and exits HSPMI 300 as a component of an output beam 370.

The reference beam is the component of input beam 360 initially reflected by PBS 310. The reference beam passes between PBS 310 and reference mirror 330 twice. On each pass, quarter wave plate 350 transforms the polarization state of the reference beam by 90°. Thus, after the first pass of the reference beam to reference mirror 330, PBS 310 transmits the reference beam. After the reference beam's second pass to reference mirror 330, PBS 310 reflects the reference beam, which exits the interferometer 300 as a component of output beam 370.

Displacement measuring interferometers other than HSPMI's can also be used in lithography tool 100. In general, multi-axis interferometry systems, such as the interferometry system used in tool 100, can include single axis interferometers, multi-axis interferometers, or combinations of single axis and multi-axis interferometers. For example, in some embodiments, interferometers 210 and 220 can be replaced by a multi-axis interferometer and interferometers 230 and 240 can be replaced by a second multi-axis interferometer. Examples of other displacement measuring interferometers include single beam interferometers and/or high accuracy plane mirror interferometers (in which the measurement beam can pass to the measurement object more than twice, e.g., four times). Additional examples of interferometer configurations are described in U.S. patent application Ser. No. 10/364,300 entitled "SEPARATED BEAM MULTIPLE DEGREE OF FREEDOM INTERFEROMETER," which claims priority to U.S. Provisional Patent Applications No. 60/356,394 entitled "Separated Beam Multiple Degree Of Freedom Interferometers" and U.S. patent application Ser. No. 10/351,707 entitled "MULTIPLE DEGREE OF FREEDOM INTERFEROMETER," which claims priority to U.S. Provisional Application No. 60/379,987 entitled "MULTIPLE DEGREE OF FREEDOM HIGH STABILITY PLANE MIRROR INTERFEROMETER," both of which are by Henry A. Hill, and also described in an article entitled "Differential interferometer arrangements for distance and angle measurements: Principles, advantages and applications" by C. Zanoni, *VDI Berichte* Nr. 749, 93-106 (1989). The contents of the cited U.S. Provisional Patent Applications 60/356,394 and 60/379,987 and the article by Zanoni are incorporated herein in their entirety by reference.

Furthermore, although the foregoing discussion includes a description of heterodyne interferometry, homodyne detection schemes can also be used.

With regard to determining $(\partial \tilde{d}_1)/(d_1 \partial x_1)$, $\alpha_x$, $\alpha_y$, $\beta_x$, $\beta_y$, $\gamma_x$, and $\gamma_y$, and/or other sources of non-cyclic errors in interferometry systems, in general, one or more of the error terms can be determined while calibrating the interferometry system or components of the interferometry system prior to installing the system in lithography tool 100. Alternatively, or additionally, one or more of the error terms can be determined after the interferometry system is installed in lithography tool 100. In these embodiments, error terms can be determined after installation of the interferometry system but prior to use of the lithography tool, and/or during periods where the lithography tool is off-line.

Methods for characterizing interferometer errors and interferometer component errors prior to installation (or once installed, but using a separate characterization apparatus) are described, for example, in U.S. patent application Ser. No. 10/366,587, and entitled "CHARACTERIZATION AND COMPENSATION OF NON-CYCLIC ERRORS IN INTERFEROMETRY SYSTEMS," by Henry A. Hill, the entire contents of which are hereby incorporated by reference.

Additional methods for characterizing mirrors include, for example, those disclosed in U.S. patent application Ser. No. 09/853,114 entitled "IN-SITU MIRROR CHARACTERIZATION", by Henry A. Hill, the entire contents of which are hereby incorporated by reference.

Figure 5:
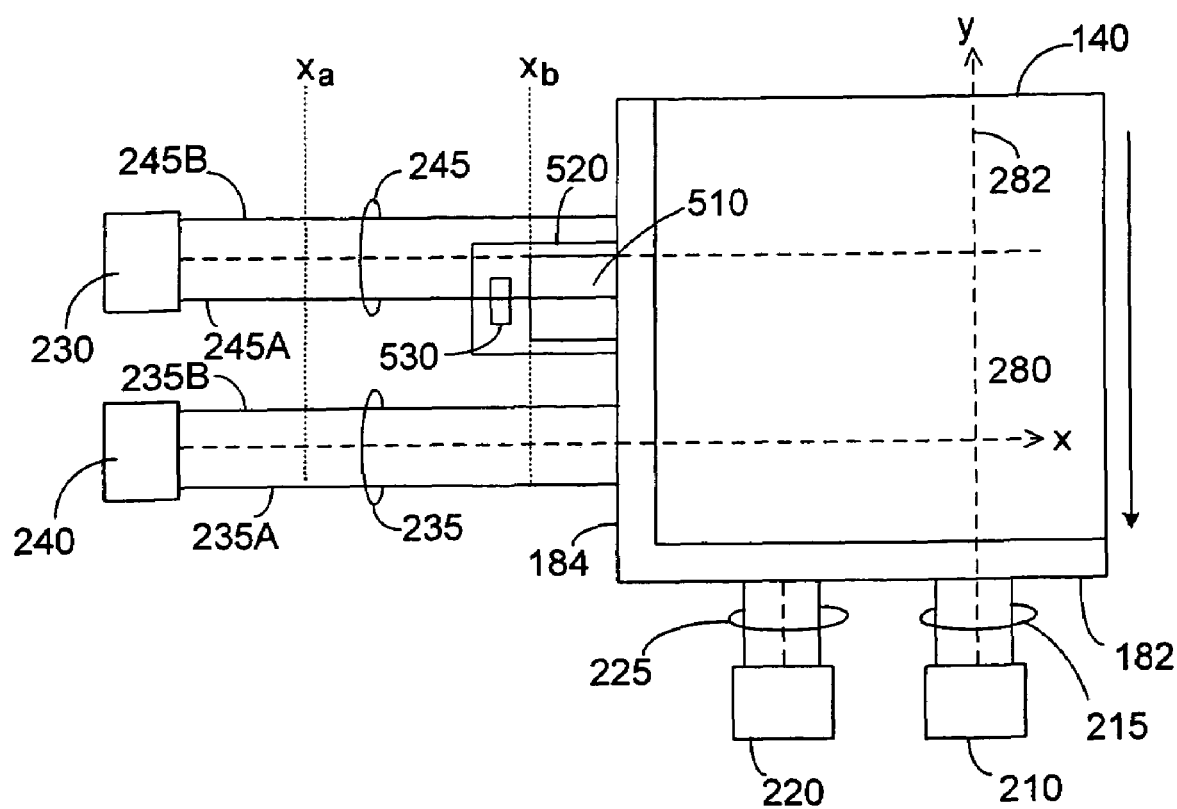
FIG. 5 is a plan view of the stage and interferometry system including a detector for measuring beam position.

Measurement axis misalignment, represented by $(\partial \tilde{d}_1)/(d_1 \partial x_1)$, can be measured using a variety of methods. In some embodiments, measurement axis misalignment can be determined by measuring the separation of the measurement beams of interferometers 230 and 240 at two or more different positions along a measurement beam axis. Referring to FIG. 5, for example, during a calibration procedure, a detector 510 is attached to stage 140 facing interferometers 230 and 240. Detector 510 is mounted on a detector stage 520, which is affixed to stage 140. Stage 140 is scanned in the y-direction so that detector 510 passes through beams 235A, 235B, 245A, and 245B, and the location of each beam is determined from the detector signal. This is repeated for different positions along the x-axis, e.g., $x_a$ and $x_b$.

Optionally, an aperture 530, e.g., an aperture slit, is also mounted on detector stage 510. Aperture 530 can reduce noise in a detection signal generated by detector 510 by reducing an amount of extraneous light reaching the detector.

The location of beams 235A, 235B, 245A, and 245B are determined from the positions of mirror 182 at which the detected intensity of each beam is a local maximum. The position of mirror 182 is monitored using interferometers 210 and 220 during the characterization scan. In embodiments where the measurement axes of interferometers 230 and 240 are nominally the midpoint between their respective first and second pass measurement beams, $\tilde{d}_1$ can be determined at $x_a$ and $x_b$ from the equation $$\tilde{d}_1(x_m) = \frac{\frac{1}{2}(y_{245B}(x_m) + y_{245A}(x_m)) - \frac{1}{2}(y_{235B}(x_m) + y_{235A}(x_m))}{2}, \quad (26)$$

where $y_v(x_m)$ is the location of beam v at location $x_m$, where v is 235A, 235B, 245A, or 245B, and m is a or b.

The term $$\frac{\partial \tilde{d}_1}{\partial x_1}$$

can then be determined according to the equation $$\frac{\partial \tilde{d}_1}{\partial x_1} = \frac{\tilde{d}_1(x_b) - \tilde{d}_1(x_a)}{x_b - x_a}. \quad (27)$$

Errors that result in a change of a beam's direction can be measured by monitoring the beam's direction, or the direction of a secondary beam derived from the beam, as a function of the stage's position. These errors include, for example, $\alpha_x$, $\alpha_y$, $\beta_x$, $\beta_y$, $\gamma_x$, and $\gamma_y$, which are related to the direction of an interferometer's input beam, measurement beam, and output beam. These errors also include errors in the figure of a plane mirror measurement object, including the average and local slope of the mirror surface.

The direction of a beam can be monitored directly, or can be monitored by monitoring the direction of a secondary beam derived from the beam. In some embodiments, a beam splitter can be used to derive a secondary beam from another beam. Variations in the direction of the first beam will result in corresponding changes in the direction of the derived beam. As an example, a beam splitter can be positioned between an interferometer and a light source for the interferometer. The beam splitter can split off a portion of the input beam. Monitoring the direction of the beam split off by the beam splitter allows one to monitor the direction of the input beam without substantially affecting the performance of the interferometer. Similarly, beam splitters can be used to monitor the direction of the output beam (e.g., by placing the beam splitter between the interferometer and the detector), and/or the direction of one or more measurement beams (e.g., by positioning the beam splitter between the interferometer and the measurement object).

In general, the direction of a beam can be monitored using a variety of techniques. For example, in some embodiments, beam direction can be monitored using an angular displacement interferometer. Details of angular displacement interferometers are described in PCT Publication WO 00/66969 by Henry A. Hill, published on Nov. 9, 2000, and in U.S. patent application Ser. No. 10/272,034, entitled "INTERFEROMETER FOR MEASURING CHANGES IN OPTICAL BEAM DIRECTIONS," filed on Oct. 15, 2002, for example. The contents of PCT Publication WO 00/66969 and U.S. patent application Ser. No. 10/272,034 are hereby incorporated by reference in their entirety.

As an example, in some embodiments, an angular displacement interferometer can be used to measure $\xi_i$. Non-cyclic error $\xi_i$ is equal to the average of $\xi_{i,1}$ and $\xi_{i,2}$, i.e., $$\xi_i = \frac{1}{2}(\xi_{i,1} + \xi_{i,2}). \tag{28}$$

Information about the difference in local slopes $\partial(\xi_{i,2}-\xi_{i,1})/\partial y$ can be obtained directly from the electrical interference signal generated by the detection of the output beam of an angular displacement interferometer while scanning the measurement object through the math of a measurement beam. The phase of the detected electrical interference signal $\phi_{i,\theta}$ is related to $\partial(\xi_{i,2}-\xi_{i,1})/\partial y$ according to the equation $$\varphi_{i,\theta} = kb\left[\frac{\partial(\xi_{i,2}-\xi_{i,1})}{\partial y}\right] \tag{29}$$

where wavenumber $k=2\pi/\lambda$ and b is an effective beam shear introduced by the angle interferometer between the components of the input beam to the angle interferometer. For further description of the properties of the angle interferometer and of the electrical interference signal generated by the detection of the output beam of the angle interferometer, reference is made to cited U.S. patent application Ser. No. 10/872,304.

In certain embodiments, beam directions can be monitored using a Hartmann-Shack interferometer. Hartmann-Shack interferometers utilize a lenslet array, which is placed in the path of a pair of overlapping beams to be measured. A detector is positioned at the focal plane of the lenslet array. When the beams are coincident and their paths are parallel to the optical axes of the lenslets, the beams are focused to an array of spots also coincident with the lenslet optical axes. However, deviations of one of the beam's directions cause it to be focused to a different location from those corresponding to the undeviated beam. The detector can track these deviations, and the data can be used to calculate the beam propagation direction based on the properties and location of the lenslet array. Use of Hartmann-Shack interferometers (also termed Hartmann-Shack sensors) in other applications is disclosed, for example, by J. Liang and co-workers in "Objective measurement of wave aberrations of the human eye with the use of a Hartmann-Shack wavefront sensor," J. Opt. Soc. Am. (A), 11, 1949-57 (1994), by J. Liang and D. R. Williams in "Aberrations and retinal image quality of the normal human eye," J. Opt. Soc. Am. (A), 14, 2873-83 (1997), and P. M. Prieto and co-workers in "Analysis of the performance of the Hartmann-Shack sensor in the human eye," J. Opt. Soc. Am. (A), 17, 1388-98 (2000).

Non-interferometric methods of monitoring beam direction include, for example, tracking the beam direction using a pixilated detector array (e.g., a CCD or CMAS camera). As the beam direction changes, it impinges on different detector elements in the array. By tracking the location of the beam on the array while scanning measurement object displacement, orientation angle, and input beam direction, the system can determine variations of the beam direction as a function of the scanned parameters. When using a pixilated detector array, the optical path of the tracked beam to the detector array should be sufficiently long to provide angular deviations that can be detected for the range of interest of beam deviations.

While the aforementioned deviations can be monitored directly using techniques disclosed herein, imperfections in components of the interferometry system (including surface imperfections of the plane mirror measurement object) can also be characterized in other ways. For example, imperfections in the reflecting surface of the plane mirror measurement object (e.g., variations in the mirror's surface topography) can be accounted for by measuring the mirror's figure, which is a measure of a mirror's surface topography. The figure of each measurement object can be characterized, for example, using a Fizeau interferometer. The figure of the portions of the measurement objects may also be determined by techniques such as described in cited commonly owned U.S. patent application Ser. No. 09/853,114 entitled "IN-SITU STAGE MIRROR CHARACTERIZATION," filed May 10, 2001, U.S. patent application Ser. No. 10/217,531, also entitled "IN-SITU MIRROR CHARACTERIZATION," filed on Aug. 13, 2002, International Patent Application No. PCT/US02/25652 entitled "IN-SITU STAGE MIRROR CHARACTERIZATION" and U.S. patent application Ser. No. 10/406,749, entitled "METHOD AND APPARATUS FOR STAGE MIRROR MAPPING," filed Apr. 3, 2003, which claims priority to Provisional Patent Application 60/371,172 filed on Apr. 9, 2002, with the same title. These applications name Henry Allen Hill as inventor, and the entire contents of each is hereby incorporated by reference.

In embodiments where imperfections in optical components are measured directly, the beam path deviations can be determined from the imperfections using known relationships between the imperfections and beam paths. For example, ray tracing tools can be used to provide beam anticipated beam paths through an interferometer based on, e.g., empirical data related to optical surfaces and bulk imperfections in system components.

During error calibration and/or during use of system 100, $\theta_z$ and $\theta_y$ can be monitored interferometrically or by other methods. Interferometric methods for monitoring an orientation angle of a plane mirror measurement object are well established in the art. One way to interferometrically monitor the angular orientation of a plane mirror measurement object is to use two displacement measuring interferometers (e.g., two HSPMIs). Where the distance between the interferometer measurement axes is known, the interferometers can be used to provide the measurement object orientation within a first plane defined by the measurement axes. Angular orientation of the measurement object in a plane perpendicular to the first plane can be determined by using a third displacement measuring interferometer, wherein the third displacement measuring interferometer is positioned so that its measurement axis and the measurement axis of one of the other interferometers define a plane perpendicular to the first plane. Such multi-axis measurements may be performed using multiple discrete interferometers, such as multiple HSPMIs, or using a multiple axis metrology system that monitors the location of a measurement object in multiple degrees of freedom. Examples of multiple axis metrology systems are disclosed in U.S. Pat. No. 6,313,918, entitled "SINGLE-PASS AND MULTI-PASS INTERFER- OMETRY SYSTEMS HAVING A DYNAMIC BEAM-STEERING ASSEMBLY FOR MEASURING DISTANCE, ANGLE, AND DISPERSION," in U.S. patent application Ser. No. 10/352,616, filed Jan. 28, 2003 and entitled "MULTIPLE-PASS INTERFEROMETRY," and in U.S. patent application Ser. No. 10/351,707, filed Jan. 27, 2003 and entitled "MULTIPLE DEGREE OF FREEDOM INTERFEROMETER," all by Henry A. Hill.

In some embodiments, interferometer pair 210 and 220 and interferometer pair 230 and 240 can be used to measure changes in an average slopes of respective reflective surfaces in the x-y plane. The average slope of a reflective surface is defined as the difference in distance in a direction, such as the x-direction, to two separated positions on the reflecting surface in the x-y plane divided by the lateral separation of the two positions. The in situ characterization used in the first embodiment is based on measured average slopes of reflecting surfaces 182 and 184.

In some embodiments, certain contributions to $\psi_3$ can be determined in situ by running an error characterization procedure, also referred to as the error characterization mode. A first section, Section 1, of an error characterization mode addresses the effect of errors in the surface of mirror 184 and a second section, Section 2, addresses certain effects of errors introduced by the interferometers. In Section 1 of the error characterization mode, stage 140 is translated in the y-direction while keeping the x-position of the stage substantially constant and while monitoring $\tilde{x}_1$ and $\tilde{x}_2$. In Section 2, stage 140 is translated in the x-direction while keeping the y-position of the stage substantially constant and while monitoring $\tilde{x}_1$ and $\tilde{x}_2$. Scans are repeated in Section 2 for a number of nominal stage orientation angles.

During the scan in Section 1 of the error characterization mode, the stage is scanned for the x-position closest to interferometers 230 and 240, $x_{min}$, and for $\tilde{\theta}(x, y)$ nominally equal to zero (hereinafter $\theta_0$). Measurement beams 235 and 245 of interferometers 230 and 240, respectively, scan mirror surface 184 along a datum line and generate signals containing information indicative of the mirror surface angular orientation and apparent surface departure (i.e., surface unevenness) in the x-y plane from a nominal plane, along with any contributions due to variations in the translation mechanism for moving stage 140 and other sources of error (e.g., cyclic non-linearities, and stationary and non-stationary effects of a gas in measurement paths of beams of interferometers 230 and 240). The scan produces $\tilde{X}_1(x, y, \theta_{2,1})$ and $\tilde{X}_2(x, y, \theta_{2,1})$ corresponding to displacement measurements from interferometers 230 and 240 respectively.

Simultaneous with translation of stage 140 in the y-direction, interferometers 210 and 220 monitor the orientation of mirror surface 182 for fixed intercept points of measurement beams 215 and 225 with surface 182. This step permits monitoring changes in $\theta_{2,1}$, due to, for example, the rotation of stage 140 due to mechanical contributions of its translation mechanism, such as bearings, drive mechanisms, and the like. Measurement of the angular orientation of mirror surface 182 provides a redundant measure of the angular orientation of stage 140 during the scan, which can be used to remove the contribution of angular rotations of stage 140 from the $\tilde{X}_1(x, y, \theta_{2,1})$ and $\tilde{X}_2(x, y, \theta_{2,1})$ data.

As noted, the stage is scanned in Section 1 of the error characterization mode for the x-position closest to interferometers 230 and 240 and for $\theta_{2,1}$ nominally equal to zero. Beam shears are typically significantly reduced when $\theta_{2,1}$ is nominally equal to zero and the displacement of the mirror from the interferometers is smallest so that the contribution of errors due to beam shear for this scan can be ignored.

Accordingly, once corrected for any angular rotations of stage 140 that occurred during the scan, $\tilde{X}_1(x_{min}, y, \theta_{2,1})$ and $\tilde{X}_2(x_{min}, y, \theta_{2,1})$ provide a measure of the average slope of mirror surface 184 along the datum line and the corresponding measured quantities $\phi_{i,\theta}$ provide information about the difference in local slopes $\partial(\xi_{i,2}-\xi_{i,1})/\partial y$. Note that there is no contribution from stage rotations to $\partial(\xi_{i,2}-\xi_{i,1})/\partial y$. Where the contribution from stage rotations is zero to the measured average slope, the average slope, $<dx/dy>_{Map}$, is given by $$\left\langle \frac{dx}{dy} \right\rangle_{Map} (0, y, \partial_{2,1}) \equiv \frac{\tilde{X}_2(0, y, \partial_{2,1}) - \tilde{X}_1(0, y, \partial_{2,1})}{d_1}, \quad (30)$$

where the subscript Map refers to data acquired during the error characterization mode and the minimum values $x_{min}$ and $y_{min}$ or initial values of x and y, respectively, are zero. A linear fit to the $<dx/dy>_{Map}$ data yields slope $<dx/dy>_{fit}$ and intercept $[\tilde{X}_2(0, 0, \theta)-\tilde{X}_1(0, 0, \theta)]_{fit}$, which provides a nominal reference surface.

Deviations of the measured position of the mirror surface from the nominal reference surface calculated from slope $<dx/dy>_{fit}$ and intercept $[\tilde{X}_2(0, 0, \theta)-\tilde{X}_1(0, 0, \theta)]_{fit}$ are attributed to mirror imperfections of mirror 184. The relationship between $(\psi_2-\psi_1)_M$, the contribution of mirror imperfections to $(\psi_2-\psi_1)$, and $[\tilde{X}_2(0, y, \theta_0)-\tilde{X}_1(0, y, \theta_0)]$ is given by $$(\psi_2-\psi_1)_M = \tilde{X}_2(0, y, \theta_0) - \tilde{X}_1(0, y, \theta_0) - \{y<dx/dy>_{fit}+[\tilde{X}_2(0, 0, \theta_0) - \tilde{X}_1(0, 0, \theta_0)]_{fit}\}. \quad (31)$$

Similar mirror error characterization procedures are described in U.S. patent application Ser. No. 10/406,749 and entitled "METHOD AND APPARATUS FOR STAGE MIRROR MAPPING," and U.S. patent application Ser. No. 10/630,361 and entitled "COMPENSATION FOR ERRORS IN OFF-AXIS INTERFEROMETRIC MEASUREMENTS," both by Henry A. Hill, the entire contents both of which are hereby incorporated herein by reference.

The contributions of interferometer imperfections errors to $(\psi_2-\psi_1)$, i.e., $(\psi_2-\psi_1)_I$, are determined in two steps of Section 2 of the error characterization mode. The first step of Section 2 determines the differential mode component $(\psi_{20}-\psi_2)_M$ for mirror surface 182. The second step of Section 2 determines the sum of the differential mode components $(\psi_2-\psi_1)_I$ and $(\psi_{20}-\psi_2)_M$. The results of the first step of Sectio 2 is then subtracted from the results of the second step of Section 2 to obtain the differential mode component $(\psi_2-\psi_1)_I$ for interferometers 230 and 240.

The description of the first step of Section 2 for obtaining $(\psi_{20}-\psi_{10})_M$ is the same as corresponding portions of the description given for Section 1 for obtaining $(\psi_2-\psi_1)_M$. For the first step of Section 2, the stage is scanned for the y-position closest to interferometers 210 and 220, $y_{min}$, and for $\tilde{\theta}(x, y)$ nominally equal to zero. Measurement beams 215 and 225 of interferometers 210 and 220, respectively, scan mirror surface 182 along a datum line and generate signals containing information indicative of the mirror surface angular orientation and apparent surface departure (i.e., surface unevenness) in the x-y plane from a nominal plane, along with any contributions due to variations in the translation mechanism for moving stage 140 and other sources of error (e.g., cyclic non-linearities, and stationary and non-stationary effects of a gas in measurement paths of beams of interferometers 210 and 220). The scan produces $\tilde{Y}_{10}(x, y, \theta_{2,1})$ and $\tilde{Y}_{20}(x, y, \theta_{2,1})$, corresponding to displacement measurements from interferometers 210 and 220 respectively.

Simultaneous with translation of stage 140 in the x-direction, interferometers 230 and 240 monitor the orientation of mirror surface 184 for fixed intercept points of measurement beams 235 and 245 with surface 184. This procedure permits monitoring changes in $\theta_{2,1}$, due to, for example, the rotation of stage 140 due to mechanical contributions of its translation mechanism, such as bearings, drive mechanisms, and the like. Measurement of the angular orientation of mirror surface 184 provides a redundant measure of the angular orientation, $\tilde{\theta}_{2,1}(x, y)$, of stage 140 during the scan, which can be used to remove the contribution of angular rotations of stage 140 from the $\tilde{Y}_{10}(x, y, \theta_{2,1})$ and $\tilde{Y}_{20}(x, y, \theta_{2,1})$ data.

As noted, the stage is scanned in the first step of Section 2 for the y-position closest to interferometers 210 and 220 and for $\tilde{\theta}_{2,1}(x, y)$ nominally equal to zero. Beam shears are typically reduced when $\tilde{\theta}_{2,1}(x, y)$ nominally equal to zero and the displacement of the mirror from the interferometers is smallest so that the contribution of errors due to beam shear to $\tilde{Y}_{10}(x, y, \theta_{2,1})$ and $\tilde{Y}_{20}(x, y, \theta_{2,1})$, for this scan be ignored. Accordingly, once corrected for any angular rotations of stage 140 that occurred during the scan, $\tilde{Y}_{10}(x, y_{min}, \theta_0)$ and $\tilde{Y}_{20}(x, y, \theta_0)$ provide a measure of the average slope of mirror surface 182 along the datum line. Where there is no contribution from stage rotations, the average slope, $<dy/dx>_{Map}$ is $$\left\langle \frac{dx}{dy} \right\rangle_{Map}(x, 0, \partial_{2,1}) \equiv \frac{\tilde{Y}_{20}(x, 0, \partial_{2,1}) - \tilde{Y}_{10}(x, 0, \partial_{2,1})}{d'_1}. \tag{32}$$

A linear fit to the $<dy/dx>_{Map}$ data yields $<dy/dx>_{fit}$ and intercept $[\tilde{Y}_{20}(0, 0, \theta_{2,1}) - \tilde{Y}_{10}(0, 0, \theta_{2,1})]_{fit}$, which provides a nominal reference surface.

Deviations of the measured position of the mirror surface 182 from a nominal position of the mirror surface calculated from slope $<dy/dx>_{fit}$ and intercept $[\tilde{Y}_{20}(0, 0, \theta_{2,1}) - \tilde{Y}_{10}(0, 0, \theta_{2,1})]_{fit}$ are attributed to mirror imperfections of mirror 182. The relationship between $(\psi_{20} - \psi_{10})_M$, the contribution of mirror imperfections to $(\psi_{20} - \psi_{10})$, and $[\tilde{Y}_{20}(x, 0, \theta_{2,1}) - \tilde{Y}_{10}(x, 0, \theta_{2,1})]$ is given by $$(\psi_{20} - \psi_{10})_M = \tilde{Y}_{20}(x, 0, \theta_0) - \tilde{Y}_{10}(x, 0, \theta_0) - \{x < dy/dx >_{fit} + [\tilde{Y}_{20}(0, 0, \theta_0) - \tilde{Y}_{10}(0, 0, \theta_0)]_{fit}\}. \tag{33}$$

For the step two of Section 2 of the error characterization mode, the step one of Section 2 is repeated except for $\tilde{\theta}_{2,1}(x, y)$ having nominal non-zero values determined by an end use application. The corresponding deviations of the measured average slope of the mirror surface 182 obtained in the step 2 of Section 2 from the corresponding average slope of the mirror surface 182 obtained from the first step of Section 2 are attributed to interferometer imperfections $(\psi_2 - \psi_1)_1$. Contributions to $\psi_1$ and $\psi_2$ from imperfections in the interferometers are expected to be dependent on nominal x values and nominal $\theta_{2,1}$ values. In the absence of mirror and interferometer imperfections, and stage rotations, $\tilde{X}_2 - \tilde{X}_1$ should remain constant for each scan in x. Thus, once contributions attributable to changes in $\theta_{2,1}$ monitored using interferometers 210 and 220 and to mirror imperfections in mirror 182, residual variations in $\tilde{X}_2 - \tilde{X}_1$ during each subsequent scan are attributed to interferometer imperfections of interferometers 230 and 240. In other words, a "mirror profile" can be determined for each scan as described for the initial scan and variations between the mirror profile determined from the initial scan and mirror profiles determined from subsequent scans are attributed to the interferometers.

Variations between the mirror profiles are parameterized as functions of x, y, and $\theta_{2,1}$. The variations may be stored in a lookup table in controller 170 and used to compensate measurements during operation of lithography tool 100. The error terms may be represented functionally. For example, the error terms may be represented by a multidimensional power series in x, y, and $\theta_{2,1}$, or in a series of orthogonal functions and coefficients of the representations stored in the lookup tables.

In some embodiments, information obtained during the error characterization mode may be "spatially filtered" to obtain the requisite information from differential mode components about certain of the common mode components of $\psi_3$. Spatial filtering involves transforming scan data using an integral transform (e.g., a Fourier transform) to devolve the scan information into different spatial frequency components. The error correction term is obtained by integrating, or summing, the contribution from different spatial frequency components. Different spatial frequency components can be weighted differently to reduce the contribution (i.e., remove the contribution) from those components that reduce the accuracy of the error correction term and/or to increase the sensitivity of the correction term to certain spatial frequency components.

An example of a filtering algorithm based on integral transforms for processing differential mode components $(\psi_2 - \psi_1)_M$ for information about $\psi_{1M}$ is first obtained and the result then used to obtain information about the common mode components of $(\psi_2 + \psi_1)_M$ of $\psi_3$. A causal relationship between $\psi_{2M}$ and $\psi_{1M}$ is used in the processing to obtain information about $(\psi_2 + \psi_1)_M$ from $(\psi_2 - \psi_1)_M$. The causal relationship is $$\psi_2(x, y, 0)_M = \psi_1(x, y+d_1, 0)_M \tag{34}$$

and is a consequence of the fact that the second measurement axis is simply displaced from the first measurement axis with respect to mirror 184.

In the processing, $\psi_{1M}$ is first derived from $(\psi_2 - \psi_1)_M$ such as given in the following series of equations. Using Equation (31), the Fourier transform of $(\psi_2 - \psi_1)_M$ is written as $$F\{(\psi_2 - \psi_1)_M\} = \frac{1}{\sqrt{2\pi}} \left[ \int \psi_1(0, y+d_1, \partial_0) e^{iKy} dy - \int \psi_1(0, y, \partial_0) e^{iKy} dy \right], \tag{35}$$

$$F\{(\psi_2 - \psi_1)_M\} = \frac{1}{\sqrt{2\pi}} \int \psi_1(0, y', \partial_0) e^{iK(y'-d_1)} dy' - \frac{1}{\sqrt{2\pi}} \int \psi_1(0, y, \partial_0) e^{iKy} dy, \tag{36}$$

$$F\{(\psi_2 - \psi_1)_M\} = \frac{1}{\sqrt{2\pi}} [e^{-iKd_1} - 1] \int \psi_1(0, y, \partial_0) e^{iKy} dy, \tag{37}$$

$$F\{(\psi_2 - \psi_1)_M\} = -2i e^{-iKd_1/2} \sin\left(\frac{Kd_1}{2}\right) F[\psi_1(0, y, \partial_0)], \tag{38}$$

where $F\{X\}$ is the Fourier transform of X. From Equation (38), the Fourier transform of $\psi_{1M}$ is expressed in terms of the Fourier transform of $(\psi_2 - \psi_1)_M$ as $$F[\psi_{1M}] = i \frac{e^{iKd_1/2}}{2\sin\left(\frac{Kd_1}{2}\right)} F\{(\psi_2 - \psi_1)_M\}. \quad (39)$$

The Fourier transform of the common mode component, $(\psi_2+\psi_1)_M$ can be obtained in terms of the Fourier transform of $\psi_{1M}$ from a similar set of spatial filtering algorithms such as derived in the following series of equations.

$$F\{(\psi_2+\psi_1)_M\} = \frac{1}{\sqrt{2\pi}} \left[ \int \psi_{1,M}(x, y+d_1) e^{iKy} dy + \int \psi_{1,M}(x, y) e^{iKy} dy \right], \quad (40)$$

$$F\{(\psi_2+\psi_1)_M\} = \frac{1}{\sqrt{2\pi}} \int \psi_{1,M}(y') e^{iK(y'-d_1)} dy' + \frac{1}{\sqrt{2\pi}} \int \psi_{1,M}(y) e^{iKy} dy, \quad (41)$$

$$F\{(\psi_2+\psi_1)_M\} = \frac{1}{\sqrt{2\pi}} [e^{-iKd_1}+1] \int \psi_{1,M}(y) e^{iKy} dy. \quad (42)$$

Equations (38) and (42) are combined to obtain $F\{(\psi_2+\psi_1)_M\}$ from $F\{(\psi_2-\psi_1)_M\}$ with the result $$F\{(\psi_2+\psi_1)_M\} = i \frac{d_i}{2} \left[ \frac{\exp\left(i\frac{Kd_1}{2}\right)}{\sin\left(\frac{Kd_1}{2}\right)} \right] F\{(\psi_2-\psi_1)_M\}. \quad (43)$$

A similar spatial filtering of the measured values of $\partial(\xi_{1,2}-\xi_{1,1})/\partial y$ is performed to obtain information about $\partial(\xi_{1,2}+\xi_{1,1})/\partial y$ with the result $$F\{\partial(\xi_{1,2}+\xi_{1,1})/\partial y\} = i \frac{b_1}{2} \left[ \frac{\exp\left(i\frac{Kb_1}{2}\right)}{\sin\left(\frac{Kb_1}{2}\right)} \right] F\{\partial(\xi_{1,2}-\xi_{1,1})/\partial y\}. \quad (44)$$

The integral of $F\{\partial(\xi_{1,2}+\xi_{1,1})/\partial y\}$ yields the Fourier transform $F(\xi_{1,2}+\xi_{1,1})$. However, the Fourier transforms $F[\psi_{1M}]$, $F\{(\psi_2+\psi_1)_M\}$, and $F\{\partial(\xi_{1,2}+\xi_{1,1})/\partial y\}$ diverge, i.e., have singularities, for certain spatial frequencies and errors that occur at those frequencies cannot be obtained from Equations (39), (43), and (44), respectively. The singularities occur for the spatial frequencies that satisfy the condition $$Kd_1/2 = 0_2 \pi, 2\pi, \quad (45)$$

for Fourier transforms $F[\psi_{1M}]$ and $F\{(\psi_2+\psi_1)_M\}$ and for the spatial frequencies that satisfy the condition $$Kb_1/2 = 0, \pi, 2\pi, \quad (46)$$

for Fourier transform $F\{\partial(\xi_{1,2}+\xi_{1,1})/\partial y\}$.

Accordingly, if information about $F[\psi_{1M}]$, $F\{(\psi_2+\psi_1)_M\}$, or $F\{\partial(\xi_{1,2}+\xi_{1,1})/\partial y\}$ is to be determined using Equations (39), (43), or (44), respectively, a multiplicative weighting function should be introduced when integrating the contribution of different frequency components to the error terms given by Equations (39), (43), or (44), respectively, to limit the effect of the singularities. The design of the multiplicative weighting function can be based on considerations of the signal-to-noise ratios as a function of spatial frequency. One example of a multiplicative weighting function is $$f(K) = \begin{cases} 0 & \text{for } (2\pi m/l) - \delta K < K < (2\pi m/l) + \delta K \\ 1 & \text{otherwise} \end{cases} \quad (47)$$

where m is an integer and $\delta K << 2\pi/l$, $l=d_1$ for Equations (39) and (43), and $l=b_1$ for Equation (44).

Although the transforms in Equations (39), (43), and (44) include a weighing function $\sin^{-1}$ (Kl/2), in other embodiments other weighting functions may be used. Generally, the weighting function should increase sensitivity to those components of the mirror surface profile to which the mirror characterization method is least sensitive. Examples of weighting functions include linear, geometric, and exponential functions of K.

The information represented in the Fourier transforms $F[\psi_{1,M}]$ and $F\{\partial(\xi_{1,2}+\xi_{1,1})/2\} = F\{\xi_1\}$ can be use to obtain a map of the mirror surface without encountering problems from the singularities such as described in a related analysis in cited in U.S. patent application Ser. No. 10/406,749 and entitled "METHOD AND APPARATUS FOR STAGE MIRROR MAPPING." The two pieces of independent information are combined to yield the map of the mirror surface with a minimum error for each spatial frequency.

The determination of $(\psi_2-\psi_1)_I$:

$$(\psi_2-\psi_1)_I(x, 0, \theta_{2,1}) = [\tilde{X}_2(x, 0, \theta_{2,1}) - \tilde{X}_1(x, 0, \theta_{2,1})] - (\psi_4-\psi_3)_M. \quad (48)$$

The results of Sections 1 and 2 of the error characterization mode are used to correct for the differential mode components $(\psi_2-\psi_1)_M$ and $(\psi_2-\psi_1)_I$ and the common mode component $(\psi_2+\psi_1)_M$ in the equations for $x_{2,1}$, $x_3$, and $\bar{\theta}_{2,1}$.

Non-cyclic error functions may also be computed by using values of $\psi_1$ and $\psi_2$ that are obtained by techniques such as described in commonly owned U.S. patent application Ser. No. 10/366,587, mentioned above.

In addition, in some embodiments, additional errors introduced by various components in the interferometry system can be reduced using other methods. For example, the effect of cyclic non-linear errors can be reduced by techniques such as described in commonly owned U.S. patent application Ser. No. 10/097,365, entitled "CYCLIC ERROR REDUCTION IN AVERAGE INTERFEROMETRIC MEASUREMENTS," and U.S. patent application Ser. No. 10/616,504 entitled "CYCLIC ERROR COMPENSATION IN INTERFEROMETRY SYSTEMS," which claims priority to U.S. Provisional Application No. 60/394,418 entitled "ELECTRONIC CYCLIC ERROR COMPENSATION FOR LOW SLEW RATES," all of which are by Henry A. Hill, the contents of which are incorporated herein in their entirety by reference.

An example of another cyclic error compensation technique is described in U.S. patent application Ser. No. 10/287,898 entitled "INTERFEROMETRIC CYCLIC ERROR COMPENSATION," which claims priority to U.S. Provisional Application No. 60/337,478 entitled "CYCLIC ERROR COMPENSATION AND RESOLUTION ENHANCEMENT," by Henry A. Hill, the contents of which are incorporated herein in their entirety by reference.

Another example of a cyclic error compensation technique is described in U.S. patent application Ser. No. 10/174,149 entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," which claims priority to U.S. Provisional Patent Application 60/303,299 entitled "INTERFEROMETRY SYSTEM AND METHOD EMPLOYING AN ANGULAR DIFFERENCE IN PROPAGATION BETWEEN ORTHOGONALLY POLARIZED INPUT BEAM COMPONENTS," both by Henry A. Hill and Peter de Groot, the contents both of which are incorporated herein in their entirety by reference.

A further example of a cyclic error compensation technique is described in U.S. patent application Ser. No. 60/314,490 filed entitled "TILTED INTERFEROMETER," by Henry A. Hill, the contents of which is herein incorporated in their entirety by reference.

Other techniques for cyclic error compensation include those described in U.S. Pat. No. No. 6,137,574 entitled "SYSTEMS AND METHODS FOR CHARACTERIZING AND CORRECTING CYCLIC ERRORS IN DISTANCE MEASURING AND DISPERSION INTERFEROMETRY;" U.S. Pat. No. 6,252,668 B1, entitled "SYSTEMS AND METHODS FOR QUANTIFYING NON-LINEARITIES IN INTERFEROMETRY SYSTEMS;" and U.S. Pat. No. 6,246,481, entitled "SYSTEMS AND METHODS FOR QUANTIFYING NONLINEARITIES IN INTERFEROMETRY SYSTEMS," wherein all three are by Henry A. Hill, the contents of the three above-cited patents and patent applications are herein incorporated in their entirety by reference.

Effects of stationary and non-stationary changes of a gas in measurement paths of the interferometers may be compensated for those end use applications where required. Examples of techniques for compensation of the stationary and non-stationary effects are described in U.S. patent application Ser. No. 10/294,158 entitled "COMPENSATING FOR EFFECTS OF VARIATIONS IN GAS REFRACTIVITY IN INTERFEROMETERS," which claims priority to U.S. Provisional Patent Application No. 60/335,963 filed entitled "COMPENSATION FOR EFFECTS OF STATIONARY NON-RANDOM CHANGES AND STATIONARY RANDOM FLUCTUATIONS IN REFRACTIVITY OF GAS IN INTERFEROMETERS," and U.S. patent application Ser. No. 10/350,522 entitled "METHOD AND APPARATUS FOR COMPENSATION OF TIME-VARYING OPTICAL PROPERTIES OF GAS IN INTERFEROMETRY," which claims priority to U.S. Provisional Patent Application No. 60/352,061 entitled "NON-DISPERSIVE METHOD AND APPARATUS FOR COMPENSATION OF TURBULENCE EFFECTS OF GAS IN INTERFEROMETRY," wherein both are by Henry A. Hill, the contents of both cited applications are incorporated herein in their entirety by reference.

Lithography tools, such as tool 100, are especially useful in lithography applications used in fabricating large scale integrated circuits such as computer chips and the like. Lithography is the key technology driver for the semiconductor manufacturing industry. Overlay improvement is one of the five most difficult challenges down to and below 100 nm line widths (design rules), see, for example, the *Semiconductor Industry Roadmap*, p. 82 (1997).

Overlay depends directly on the performance, i.e., accuracy and precision, of the distance measuring interferometers used to position the wafer and reticle (or mask) stages. Since a lithography tool may produce $50-100 M/year of product, the economic value from improved performance distance measuring interferometers is substantial. Each 1% increase in yield of the lithography tool results in approximately $1 M/year economic benefit to the integrated circuit manufacturer and substantial competitive advantage to the lithography tool vendor.

The function of a lithography tool is to direct spatially patterned radiation onto a photoresist-coated wafer. The process involves determining which location of the wafer is to receive the radiation (alignment) and applying the radiation to the photoresist at that location (exposure).

As discussed previously, to properly position the wafer, the wafer includes alignment marks on the wafer that can be measured by dedicated sensors. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

Interferometry systems are important components of the positioning mechanisms that control the position of the wafer and reticle, and register the reticle image on the wafer. If such interferometry systems include the features described above, the accuracy of distances measured by the systems increases as cyclic error contributions to the distance measurement are minimized.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Interferometry systems described above can be used to precisely measure the positions of each of the wafer stage and mask stage relative to other components of the exposure system, such as the lens assembly, radiation source, or support structure. In such cases, the interferometry system can be attached to a stationary stricture and the measurement object attached to a movable element such as one of the mask and wafer stages. Alternatively, the situation can be reversed, with the interferometry system attached to a movable object and the measurement object attached to a stationary object.

More generally, such interferometry systems can be used to measure the position of any one component of the exposure system relative to any other component of the exposure system, in which the interferometry system is attached to, or supported by, one of the components and the measurement object is attached, or is supported by the other of the components.

Figure 6:
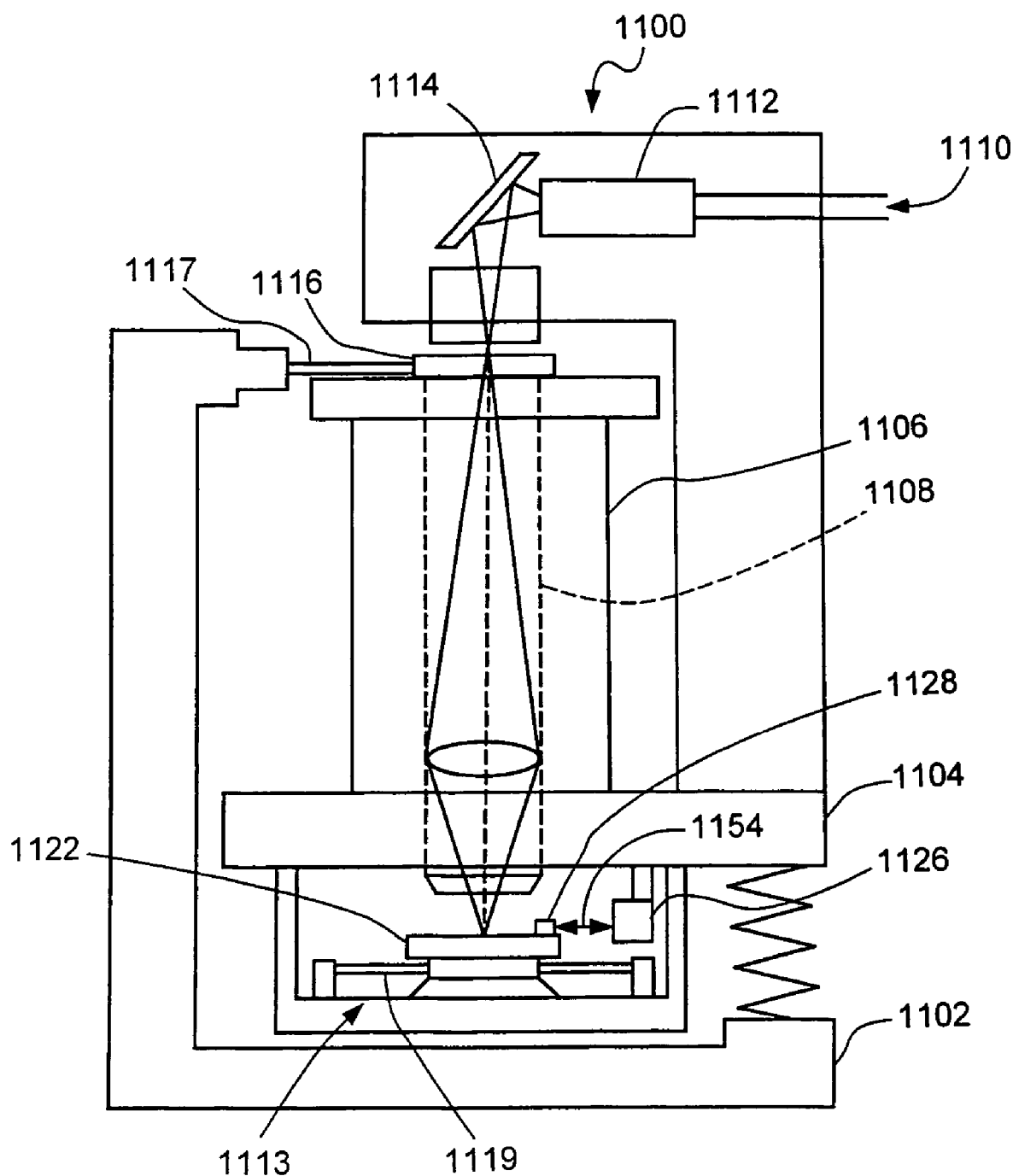
FIG. 6 is a schematic diagram of an embodiment of a lithography tool that includes an interferometer.

Another example of a lithography tool 1100 using an interferometry system 1126 is shown in FIG. 6. The interferometry system is used to precisely measure the position of a wafer (not shown) within an exposure system. Here, stage 1122 is used to position and support the wafer relative to an exposure station. Scanner 1100 includes a frame 1102, which carries other support structures and various components carried on those structures. An exposure base 1104 has mounted on top of it a lens housing 1106 atop of which is mounted a reticle or mask stage 1116, which is used to support a reticle or mask. A positioning system for positioning the mask relative to the exposure station is indicated schematically by element 1117. Positioning system 1117 can include, e.g., piezoelectric transducer elements and corresponding control electronics. Although, it is not included in this described embodiment, one or more of the interferometry systems described above can also be used to precisely measure the position of the mask stage as well as other moveable elements whose position must be accurately monitored in processes for fabricating lithographic structures (see supra Sheats and Smith *Microlithography: Science and Technology*).

Suspended below exposure base 1104 is a support base 1113 that carries wafer stage 1122. Stage 1122 includes a plane mirror 1128 for reflecting a measurement beam 1134 directed to the stage by interferometry system 1126. A positioning system for positioning stage 1122 relative to interferometry system 1126 is indicated schematically by element 1119. Positioning system 1119 can include, e.g., piezoelectric transducer elements and corresponding control electronics. The measurement beam reflects back to the interferometry system, which is mounted on exposure base 1104. The interferometry system can be any of the embodiments described previously.

During operation, a radiation beam 1110, e.g., an ultraviolet (UV) beam from a UV laser (not shown), passes through a beam shaping optics assembly 1112 and travels downward after reflecting from mirror 1114. Thereafter, the radiation beam passes through a mask (not shown) carried by mask stage 1116. The mask (not shown) is imaged onto a wafer (not shown) on wafer stage 1122 via a lens assembly 1108 carried in a lens housing 1106. Base 1104 and the various components supported by it are isolated from environmental vibrations by a damping system depicted by spring 1120.

In other embodiments of the lithographic scanner, one or more of the interferometry systems described previously can be used to measure distance along multiple axes and angles associated for example with, but not limited to, the wafer and reticle (or mask) stages. Also, rather than a UV laser beam, other beams can be used to expose the wafer including, e.g., x-ray beams, electron beams, ion beams, and visible optical beams.

In some embodiments, the lithographic scanner can include what is known in the art as a column reference. In such embodiments, the interferometry system 1126 directs the reference beam (not shown) along an external reference path that contacts a reference mirror (not shown) mounted on some structure that directs the radiation beam, e.g., lens housing 1106. The reference mirror reflects the reference beam back to the interferometry system. The interference signal produce by interferometry system 1126 when combining measurement beam 1134 reflected from stage 1122 and the reference beam reflected from a reference mirror mounted on the lens housing 1106 indicates changes in the position of the stage relative to the radiation beam. Furthermore, in other embodiments the interferometry system 1126 can be positioned to measure changes in the position of reticle (or mask) stage 1116 or other movable components of the scanner system. Finally, the interferometry systems can be used in a similar fashion with lithography systems involving steppers, in addition to, or rather than, scanners.

Figure 7A:
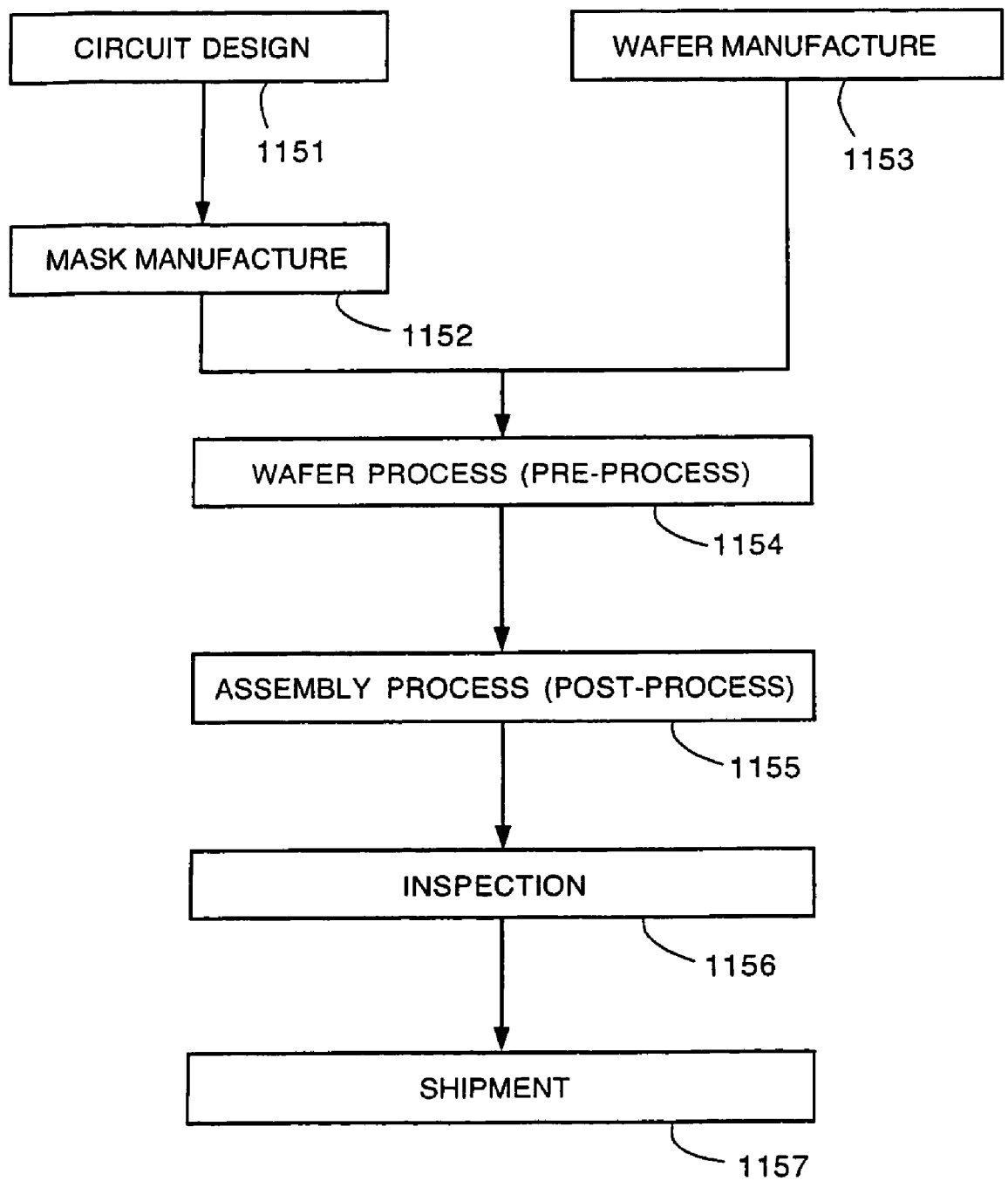
FIG. 7(a) and FIG. 7(b) are flow charts that describe steps for making integrated circuits.
Figure 7B:
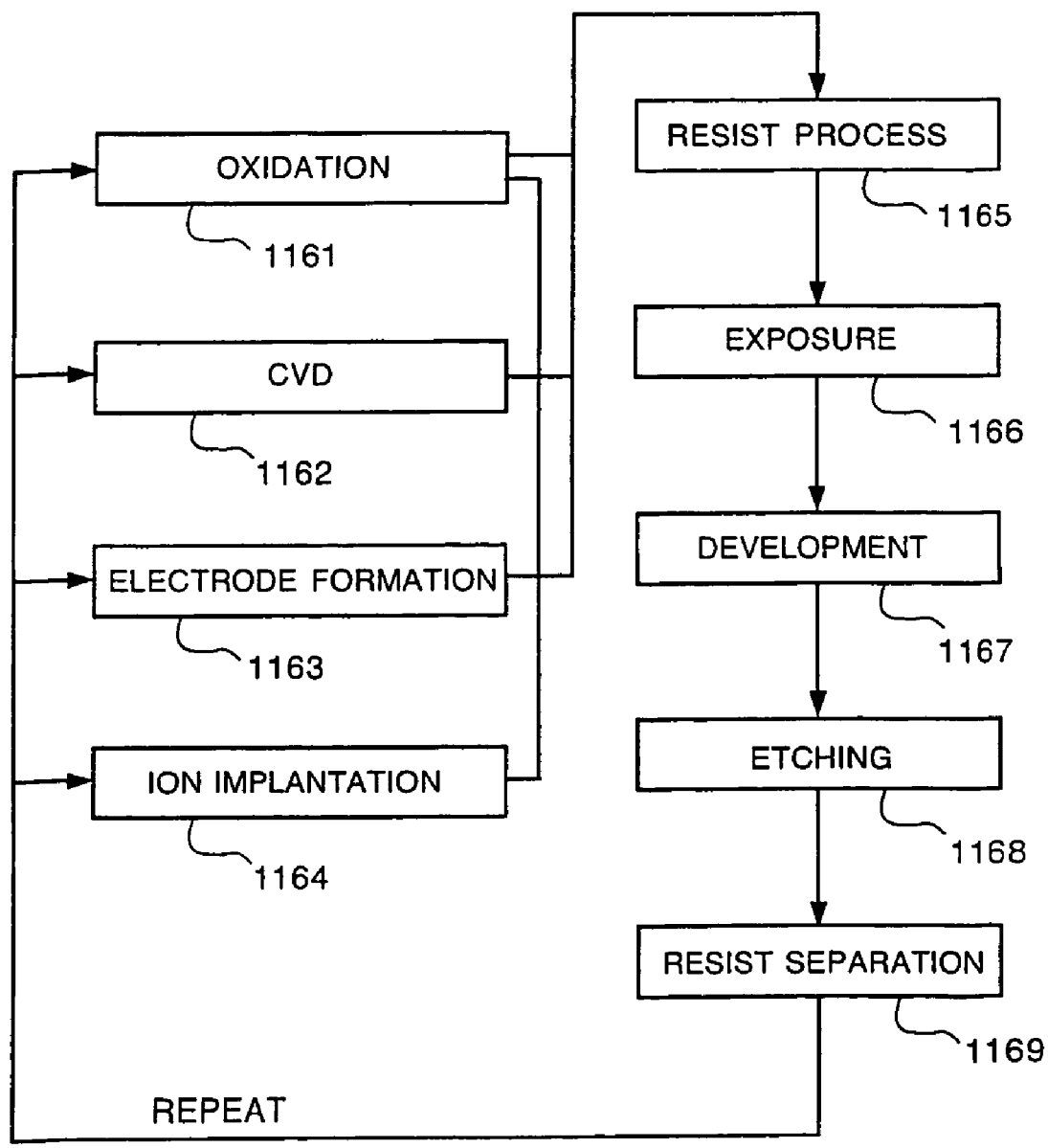

As is well known in the art, lithography is a critical part of manufacturing methods for making semiconducting devices. For example, U.S. Pat. No. 5,483,343 outlines steps for such manufacturing methods. These steps are described below with reference to FIGS. 7(a) and 7(b). FIG. 7(a) is a flow chart of the sequence of manufacturing a semiconductor device such as a semiconductor chip (e.g., IC or LSI), a liquid crystal panel or a CCD. Step 1151 is a design process for designing the circuit of a semiconductor device. Step 1152 is a process for manufacturing a mask on the basis of the circuit pattern design. Step 1153 is a process for manufacturing a wafer by using a material such as silicon.

Step 1154 is a wafer process which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The interferometry methods and systems described herein can be especially useful to improve the effectiveness of the lithography used in the wafer process.

Step 1155 is an assembling step, which is called a post-process wherein the wafer processed by step 1154 is formed into semiconductor chips. This step includes assembling (dicing and bonding) and packaging (chip sealing). Step 1156 is an inspection step wherein operability check, durability check, and so on of the semiconductor devices produced by step 1155 are carried out. With these processes, semiconductor devices are finished and they are shipped (step 1157).

FIG. 6(b) is a flow chart showing details of the wafer process. Step 1161 is an oxidation process for oxidizing the surface of a wafer. Step 1162 is a CVD process for forming an insulating film on the wafer surface. Step 1163 is an electrode forming process for forming electrodes on the wafer by vapor deposition. Step 1164 is an ion implanting process for implanting ions to the wafer. Step 1165 is a resist process for applying a resist (photosensitive material) to the wafer. Step 1166 is an exposure process for printing, by exposure (i.e., lithography), the circuit pattern of the mask on the wafer through the exposure apparatus described above. Once again, as described above, the use of the interferometry systems and methods described herein improve the accuracy and resolution of such lithography steps.

Step 1167 is a developing process for developing the exposed wafer. Step 1168 is an etching process for removing portions other than the developed resist image. Step 1169 is a resist separation process for separating the resist material remaining on the wafer after being subjected to the etching process. By repeating these processes, circuit patterns are formed and superimposed on the wafer.

The interferometry systems described above can also be used in other applications in which the relative position of an object needs to be measured precisely. For example, in applications in which a write beam such as a laser, x-ray, ion, or electron beam, marks a pattern onto a substrate as either the substrate or beam moves, the interferometry systems can be used to measure the relative movement between the substrate and write beam.

Figure 8:
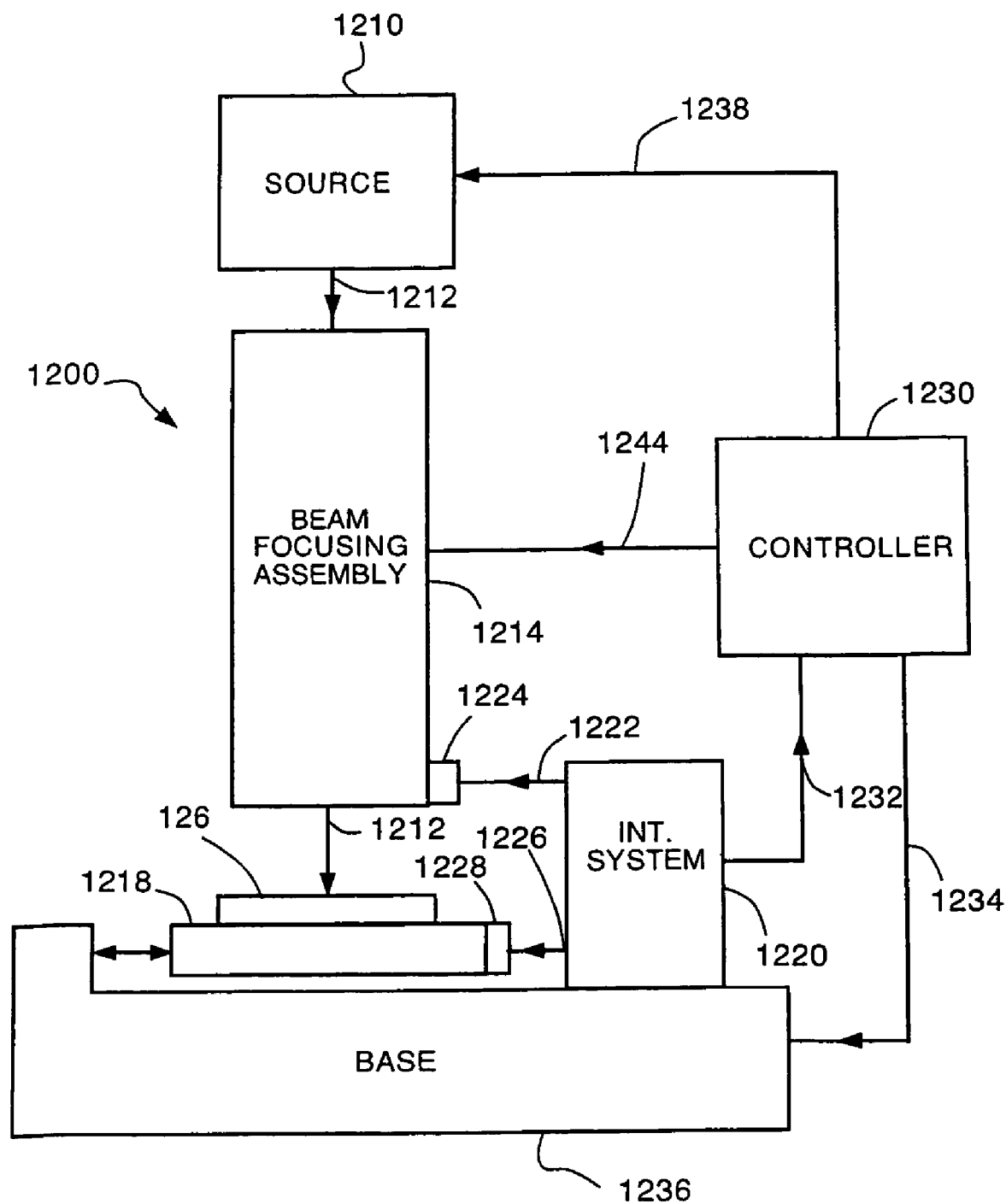
FIG. 8 is a schematic of a beam writing system that includes an interferometry system.

As an example, a schematic of a beam writing system 1200 is shown in FIG. 8. A source 1210 generates a write beam 1212, and a beam focusing assembly 1214 directs the radiation beam to a substrate 1216 supported by a movable stage 1218. To determine the relative position of the stage, an interferometry system 1220 directs a reference beam 1222 to a mirror 1224 mounted on beam focusing assembly 1214 and a measurement beam 1226 to a mirror 1228 mounted on stage 1218. Since the reference beam contacts a mirror mounted on the beam focusing assembly, the beam writing system is an example of a system that uses a column reference. Interferometry system 1220 can be any of the interferometry systems described previously. Changes in the position measured by the interferometry system correspond to changes in the relative position of write beam 1212 on substrate 1216. Interferometry system 1220 sends a measurement signal 1232 to controller 1230 that is indicative of the relative position of write beam 1212 on substrate 1216. Controller 1230 sends an output signal 1234 to a base 1236 that supports and positions stage 1218. In addition, controller 1230 sends a signal 1238 to source 1210 to vary the intensity of, or block, write beam 1212 so that the write beam contacts the substrate with an intensity sufficient to cause photophysical or photochemical change only at selected positions of the substrate.

Furthermore, in some embodiments, controller 1230 can cause beam focusing assembly 1214 to scan the write beam over a region of the substrate, e.g., using signal 1244. As a result, controller 1230 directs the other components of the system to pattern the substrate. The patterning is typically based on an electronic design pattern stored in the controller. In some applications the write beam patterns a resist coated on the substrate and in other applications the write beam directly patterns, e.g., etches, the substrate.

An important application of such a system is the fabrication of masks and reticles used in the lithography methods described previously. For example, to fabricate a lithography mask an electron beam can be used to pattern a chromium-coated glass substrate. In such cases where the write beam is an electron beam, the beam writing system encloses the electron beam path in a vacuum. Also, in cases where the write beam is, e.g., an electron or ion beam, the beam focusing assembly includes electric field generators such as quadrapole lenses for focusing and directing the charged particles onto the substrate under vacuum. In other cases where the write beam is a radiation beam, e.g., x-ray, UV, or visible radiation, the beam focusing assembly includes corresponding optics and for focusing and directing the radiation to the substrate.

Additional embodiments are in the claims.

What is claimed is:

1. A method, comprising:
monitoring a position of a stage along a first measurement axis and a second measurement axis of a multi-axis interferometry system;
determining a position of the stage with respect to another degree of freedom based on the monitored positions along the first and second axes and predetermined information about how the measurement axes deviate from being parallel to one another; and
outputting a signal based on the determined position.

2. The method of claim 1, wherein the degree of freedom of the stage is an orientation angle of the stage.

3. The method of claim 1, wherein the degree of freedom of the stage is the position of the stage along a third axis parallel to but separate from the first and second measurement axes of the multi-axis interferometry system.

4. The method of claim 3, wherein the degree of freedom of the stage corresponds to the position of an artifact with respect to the third axis.

5. The method of claim 4, wherein the artifact is an alignment mark on a wafer supported by the stage.

6. The method of claim 4, wherein the artifact is an alignment mark on the stage.

7. The method of claim 3, wherein the third axis corresponds to the position of an alignment scope positioned to locate an alignment mark on the stage.

8. The method of claim 1, wherein the predetermined information comprises information about a variation in a distance between the measurement axes.

9. The method of claim 8, wherein the predetermined information comprises information about an initial distance, $d_1$, between the axes.

10. The method of claim 9, wherein the information about a variation in a distance between the measurement axes comprises a relationship between the distance between the measurement axes and displacement of the stage along one of the measurement axes.

11. The method of claim 9, wherein the information about a variation in a distance between the measurement axes comprises a value corresponding to the rate of change of the distance between the measurement axes with respect to a position of the stage along one of the measurement axes.

12. The method of claim 1, wherein the multi-axis interferometry system produces an output beam comprising a phase related to an optical path difference between a path of a first beam and a path of a second beam, wherein the first beam contacts a measurement object associated with the stage at a first location and the first or second beam contacts the measurement object at a second location different from the first location, wherein the predetermined information accounts for contributions to the optical path difference caused by a deviation of the path of the first or second beam from a nominal beam path due to an imperfection of the measurement object at the first location and due to an imperfection of the measurement object at the second location.

13. The method of claim 12, wherein the predetermined information accounts for contributions to the optical path difference caused by a deviation of the path of the first or second beam within a plane defined by the nominal beam path due to the imperfection of the measurement object at the first or second location.

14. The method of claim 12, wherein the predetermined information accounts for contributions to the optical path difference caused by a deviation of the path of the first or second beam out of a plane defined by a nominal beam path due to the imperfection of the measurement object at the first or second location.

15. The method of claim 14, wherein the predetermined information further accounts for contributions to the optical path difference caused by a deviation of the path of the first or second beam from the nominal beam path due to an imperfection in at least one optic of the interferometry system.

16. The method of claim 15, wherein the imperfection in at least one optic of the interferometer comprises an imperfection in a surface of the optic.

17. The method of claim 15, wherein the imperfection in at least one optic of the interferometer comprises a bulk imperfection in the optic.

18. The method of claim 12, wherein the predetermined information further accounts for contributions to the optical path difference caused by a deviation of the path of the first or second beam from the nominal beam path due to an imperfection in a light source that causes an input beam derived from the light source to deviate from an input beam path to the interferometer.

19. The method of claim 1, wherein the predetermined information is stored as a representation in an electronic storage medium.

20. The method of claim 19, wherein the representation comprises a lookup table.

21. The method of claim 19, wherein the representation comprises a functional representation.

22. The method of claim 1, wherein the multi-axis interferometry system comprises a single axis interferometers.

23. The method of claim 1, wherein the multi-axis interferometry system comprises a multi-axis interferometer.

24. A lithography method for use in fabricating integrated circuits on a wafer, the method comprising:
supporting the wafer on a moveable stage;
imaging spatially patterned radiation onto the wafer;
adjusting the position of the stage; and
monitoring the position of the stage using the method of claim 1.

25. A method for fabricating integrated circuits, the method comprising:
applying a resist to a wafer;
forming a pattern of a mask in the resist by exposing the wafer to radiation using the lithography method of claim 24; and
producing an integrated circuit from the wafer.

26. A lithography method for use in the fabrication of integrated circuits comprising:
directing input radiation through a mask to produce spatially patterned radiation;
positioning the mask relative to the input radiation;
monitoring the position of the mask relative to the input radiation using the method of claim 1; and
imaging the spatially patterned radiation onto a wafer.

27. A method for fabricating integrated circuits, the method comprising:
applying a resist to a wafer;
forming a pattern of a mask in the resist by exposing the wafer to radiation using the lithography method of claim 26; and
producing an integrated circuit from the wafer.

28. A lithography method for fabricating integrated circuits on a wafer comprising:
positioning a first component of a lithography system relative to a second component of a lithography system to expose the wafer to spatially patterned radiation; and
monitoring the position of the first component relative to the second component using the method of claim 1.

29. A method for fabricating integrated circuits, the method comprising:
applying a resist to a wafer;
forming a pattern of a mask in the resist by exposing the wafer to radiation using the lithography method of claim 28; and
producing an integrated circuit from the wafer.

30. A method for fabricating a lithography mask, the method comprising:
directing a write beam to a substrate to pattern the substrate;
positioning the substrate relative to the write beam; and
monitoring the position of the substrate relative to the write beam using the method of claim 1.

31. A system, comprising:
a multi-axis interferometry system configured to monitor a position of a stage along a first measurement axis and a second measurement axis; and
an electronic controller configured to determine a position of the stage with respect to another degree of freedom based on the monitored positions along the first and second axes and predetermined information about how the measurement axes deviate from being parallel to one another.

32. The system of claim 31, wherein the multi-axis interferometry system comprises one or more single axis interferometers.

33. The system of claim 31, wherein the multi-axis interferometry system comprises a multi-axis interferometer.

34. The system of claim 31, wherein the multi-axis interferometry system is further configured to monitor a position of the stage along a third measurement axis perpendicular to the first measurement axis.

35. The system of claim 31, wherein the stage is configured to support a wafer.

36. A lithography system for use in fabricating integrated circuits on a wafer, the system comprising:
a stage for supporting the wafer;
an illumination system for imaging spatially patterned radiation onto the wafer;
a positioning system for adjusting the position of the stage relative to the imaged radiation; and
the multi-axis interferometry system of claim 31 for monitoring the position of the wafer relative to the imaged radiation.

37. A method for fabricating integrated circuits, the method comprising:
applying a resist to a wafer;
forming a pattern of a mask in the resist by exposing the wafer to radiation using the lithography method of claim 36; and
producing an integrated circuit from the wafer.

38. A lithography system for use in fabricating integrated circuits on a wafer, the system comprising:
a stage for supporting the wafer; and
an illumination system including a radiation source, a mask, a positioning system, a lens assembly, and the multi-axis interferometry system of claim 31,
wherein during operation the source directs radiation through the mask to produce spatially patterned radiation, the positioning system adjusts the position of the mask relative to the radiation from the source, the lens assembly images the spatially patterned radiation onto the wafer, and the multi-axis interferometry system monitors the position of the mask relative to the radiation from the source.

39. A method for fabricating integrated circuits, the method comprising:
applying a resist to a wafer;
forming a pattern of a mask in the resist by exposing the wafer to radiation using the lithography method of claim 38; and
producing an integrated circuit from the wafer.

40. A beam writing system for use in fabricating a lithography mask, the system comprising:
- a source providing a write beam to pattern a substrate;
- a stage supporting the substrate;
- a beam directing assembly for delivering the write beam to the substrate;
- a positioning system for positioning the stage and beam directing assembly relative one another; and
- the multi-axis interferometry system of claim 31 for monitoring the position of the stage relative to the beam directing assembly.

41. A method for determining a position of a stage with respect to at least one degree of freedom, the method comprising:
- monitoring a location, $x_1$, of the stage along a first measurement axis of a multi-axis interferometry system that produces an output beam comprising a phase related to an optical path difference between a path of a first beam and a path of a second beam, wherein the first beam contacts a measurement object associated with the stage at a first location and the first or second beam contacts the measurement object at a second location different from the first location;
- monitoring a location, $x_2$, of the stage along a second measurement axis of the multi-axis interferometry system; and
- determining the position of the stage with respect to the degree of freedom based on $x_1$, $x_2$, and a correction term $\psi_3$,
- wherein $\psi_3$ accounts for contributions to the optical path difference caused by a deviation of the path of the first or second beam from a nominal beam path due to an imperfection of the measurement object at the first location and due to an imperfection of the measurement object at the second location; and
- outputting a signal based on the determined position.

42. The method of claim 41, wherein $\psi_3$ comprises predetermined information about how the measurement axes deviate from being parallel to one another.

* * * * *